United States Patent
Roizin et al.

(10) Patent No.: US 8,501,609 B2
(45) Date of Patent: Aug. 6, 2013

(54) METHOD FOR GENERATING A THREE-DIMENSIONAL NAND MEMORY WITH MONO-CRYSTALLINE CHANNELS USING SACRIFICIAL MATERIAL

(75) Inventors: Yakov Roizin, Afula (IL); Avi Strum, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 13/365,228

(22) Filed: Feb. 2, 2012

(65) Prior Publication Data
US 2013/0052803 A1     Feb. 28, 2013

(51) Int. Cl.
*H01L 21/3205*     (2006.01)
*H01L 21/302*     (2006.01)
*H01L 21/31*     (2006.01)
*G11C 11/34*     (2006.01)

(52) U.S. Cl.
USPC ........... 438/591; 438/705; 438/738; 438/739; 438/752; 438/753; 438/761; 438/763; 438/479; 438/211; 438/264; 257/E21.18; 257/E27.103; 257/E29.309; 257/E21.09; 257/E21.645; 257/E29.255; 365/185.05; 365/185.17

(58) Field of Classification Search
USPC .................. 438/211, 479, 591, 264, 705, 738, 438/739, 752, 753, 761, 763; 257/E21.18, 257/E27.103, E29.309, E21.09, E21.645, 257/E29.255; 365/185.17, 185.05
See application file for complete search history.

(56) References Cited

U.S. PATENT DOCUMENTS

| | | | |
|---|---|---|---|
| 7,999,295 B2 | 8/2011 | Lai et al. | |
| 8,008,732 B2 * | 8/2011 | Kiyotoshi et al. | 257/390 |
| 8,030,700 B2 | 10/2011 | Sakamoto | |
| 8,048,741 B2 | 11/2011 | Arai et al. | |
| 2010/0226195 A1 | 9/2010 | Lue | |
| 2010/0244119 A1 | 9/2010 | Fukuzumi et al. | |
| 2010/0259961 A1 * | 10/2010 | Fasoli et al. | 365/51 |
| 2010/0327323 A1 * | 12/2010 | Choi | 257/202 |
| 2012/0009747 A1 * | 1/2012 | Kang et al. | 438/268 |
| 2012/0129301 A1 * | 5/2012 | Or-Bach et al. | 438/129 |
| 2012/0228694 A1 * | 9/2012 | Shimizu et al. | 257/324 |

OTHER PUBLICATIONS

Tanaka, H., et al. "Bit Cost Scalable Technology with Punch and Plug Process for Ultra High Density Flash Memory", 2007 IEEE Symp. on VLSI Tech., Jun. 12-14, 2007 Kyoto, Japan, pp. 14-15.

(Continued)

*Primary Examiner* — Chuong A Luu
*Assistant Examiner* — Cory Eskridge
(74) *Attorney, Agent, or Firm* — Bever, Hoffman & Harms, LLP; Patrick T. Bever

(57) ABSTRACT

A method for generating three-dimensional (3D) non-volatile memory (NVM) arrays includes forming multiple parallel horizontally-disposed mono-crystalline silicon beams that are spaced apart and arranged in a vertical stack (e.g., such that an elongated horizontal air gap is defined between each adjacent beam in the stack), forming separate charge storage layers on each of the mono-crystalline silicon beams such that each charge storage layer includes a high-quality thermal oxide layer that entirely covers (i.e., is formed on the upper, lower and opposing side surfaces of) each of the mono-crystalline silicon beams, and then forming multiple vertically-disposed poly-crystalline silicon wordline structures next to the stack such that each wordline structure is connected to each of the bitline structures in the stack by way of corresponding portions of the separate charge storage layers. The memory cells are accessed during read/write operations by way of the corresponding wordline and bitline structures.

20 Claims, 14 Drawing Sheets

OTHER PUBLICATIONS

Fukuzumi, Y. et al. "Optimal Integration and Characteristics of Vertical Array Devices for Ultra-High Density, Bit-Cost Scalable Flash Memory", 2007 IEEE International Electron Devices Meeting, Dec. 10-12, 2007, Washington, D.C., USA, pp. 449-452.

Lue, Hang-Ting, et al. "A Highly Scalable 8-Layer 3D Vertical-Gate (VG) TFT NAND Flash Using Junction-Free Buried Channel BE-SONOS Device", 2010 Symposium on VLSI Technology, Jun. 15-17, 2010, Honolulu, HI, USA, pp. 131-132.

Jeong, Min-Kyu, et al. "3-D Stacked NAND Flash String with Tube Channel Structure Using Si and SiGe Selective Etch Process", IEEE International Memory Workshop, Monterey, California, USA, May 10-14, 2009, 2 pages.

* cited by examiner

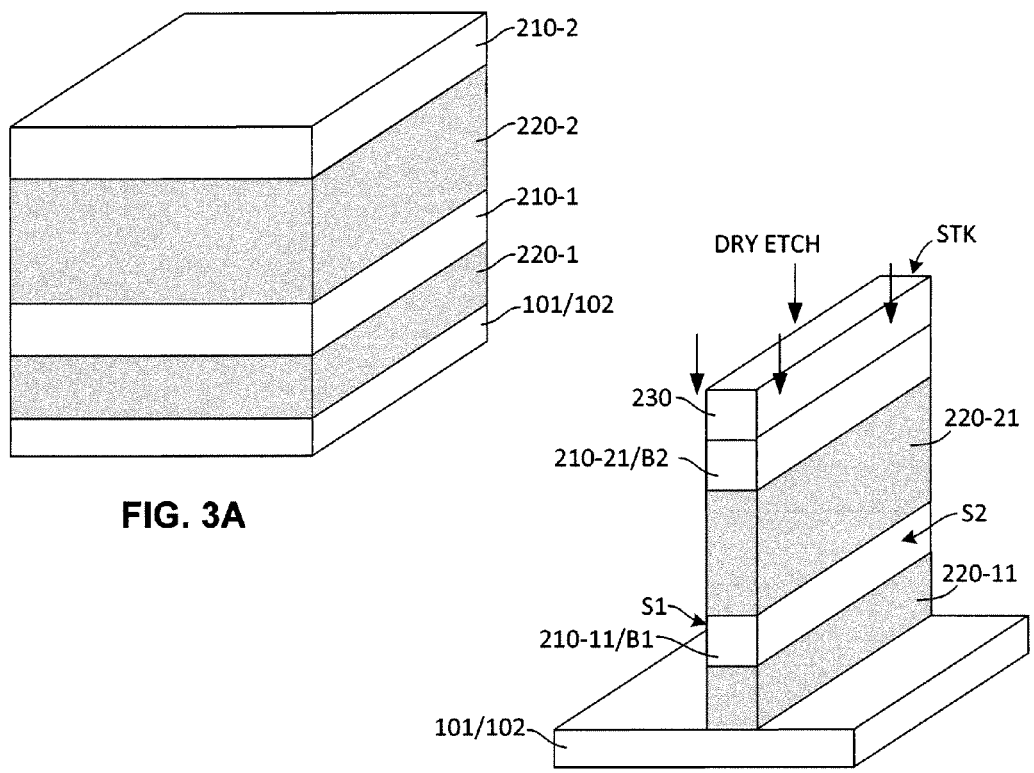
FIG. 3A
FIG. 3B
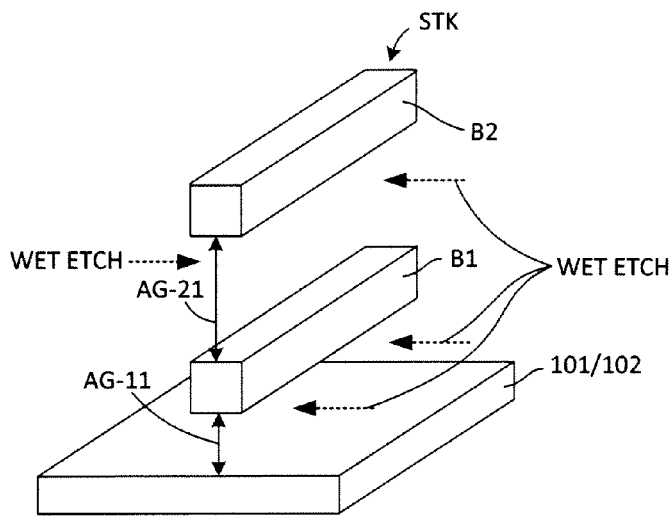
FIG. 3C

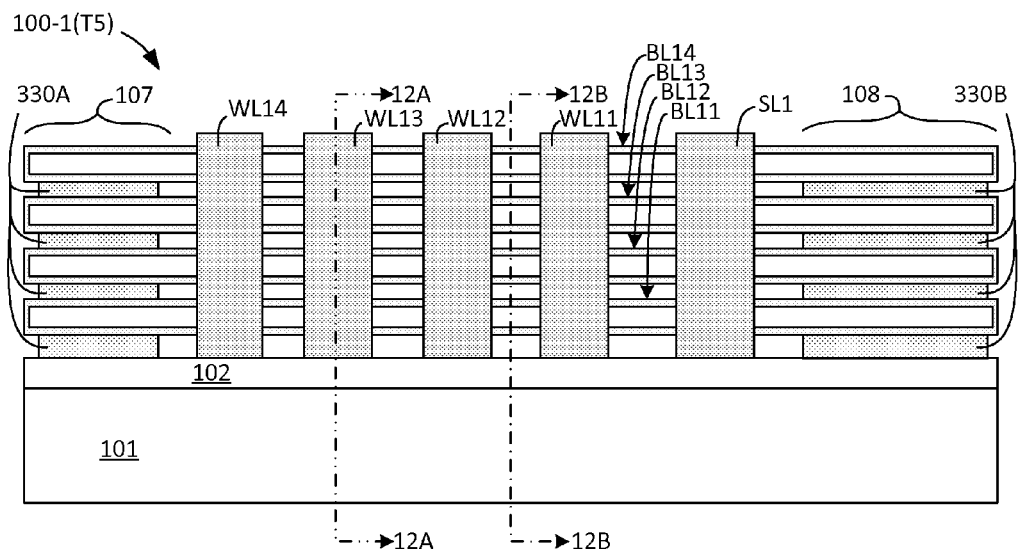
FIG. 11
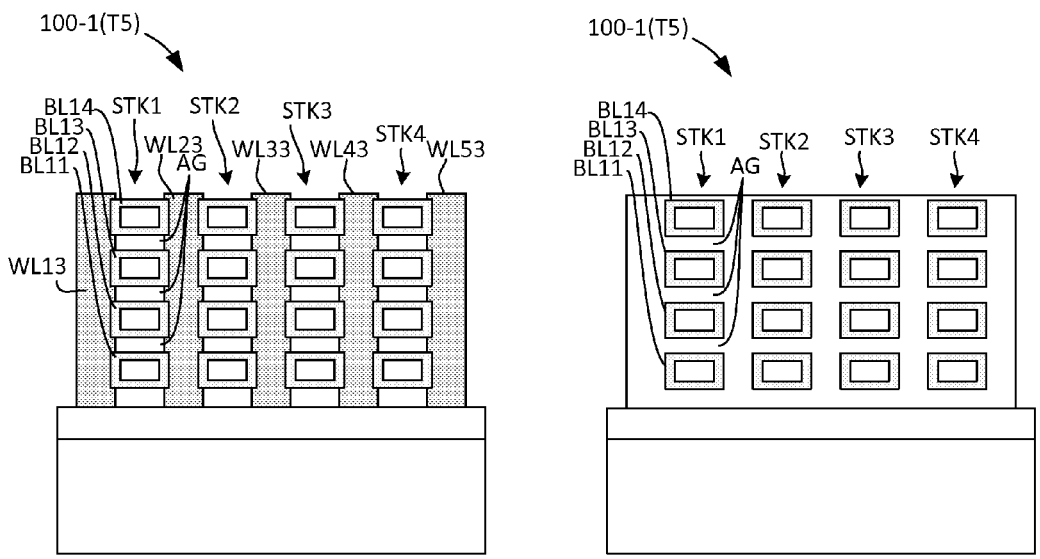
FIG. 12A
FIG. 12B

METHOD FOR GENERATING A THREE-DIMENSIONAL NAND MEMORY WITH MONO-CRYSTALLINE CHANNELS USING SACRIFICIAL MATERIAL

FIELD OF THE INVENTION

This invention relates to integrated circuit devices, and more particularly to methods for fabricating memory-type integrated circuit devices in which memory cells are arranged in three-dimensional (3D) 3D arrays.

BACKGROUND OF THE INVENTION

Despite the tremendous scaling success of poly-crystalline silicon floating gate (FG) non-volatile memory (NVM) arrays that are fabricated using 20 nm (or smaller) semiconductor fabrication technologies, further scaling of planar memory devices becomes extremely difficult. There are several fundamental reasons for this further scale reduction, including cross-talk between closely located cells, and small numbers of electrons in each FG in the programmed state. This scaling limitation makes implementation of multi-level cell (MLC) technologies featuring several levels of the stored charge in the FG extremely complicated. Hence, three-dimensional (3D) stacked memory devices are being developed to allow the continuation of the stand-alone flash memories scaling roadmap. In the field of embedded memories, 3D back-end (B/E) NVM devices are also challenging because this approach allows larger NVM arrays, even in case of CMOS technologies not scaled to the record technology nodes. Enabled by large volume (>1 Gbit) embedded memory modules, the performance of CMOS products is improved and novel applications appear.

Prior art 2D NVM memory cell arrays are usually formed on the top surface of a silicon substrate. The memory cells are located in the wafer plane and addressed by X-Y decoders. The electrons flow is in the mono-crystalline channels of silicon MOS transistors. The electron mobility in mono-crystalline silicon is high, which is reflected in efficient programming and high access speed of the memory cells. Also, the charge storage material (memory stack), where electrons are stored to set the "1" or "0" data value of each memory cell, is easily fabricated by first oxidizing the mono-crystalline silicon surface, and then depositing the silicon nitride (i.e., when forming an Oxide-Nitride-Oxide (ONO) memory stack) or other storage media (e.g., nano-dots). These memory cells are referred to as "front end" memory cells because the charge storage material is formed directly on the silicon substrate, which serves as a channel during read and write operations. There are no critical thermal budget limitations when forming a subsequent top oxide of ONO-type memory stacks. The top oxide can be formed by direct oxidation of the Nitride, or by chemical vapor deposition (CVD), or atomic layer deposition (ALD) techniques followed by densification at high temperatures. No changes are observed in the mono-crystalline silicon when these processes are used.

An obvious approach for further increasing the density of non-volatile memory devices is creating a stacked memory device, i.e., a device in which layers of memory cells are placed on top of each other. A large effort was put into designing of these types of stacked memory devices. Three dimensional back-end non-volatile memories with NVM transistors employing polycrystalline or amorphous silicon layers as bulk materials are described, e.g., in U.S. Pat. No. 8,048,741 "Semiconductor memory device and method of fabricating the same" (Arai, et al, Toshiba, 2011), U.S. Pat. No. 8,048,741 "Stacked thin film transistor, non-volatile memory devices and methods for fabricating the same" (Lai, et al, Macronix, 2011), and U.S. Pat. No. 8,030,700 Nonvolatile memory device, (Sakamoto, Toshiba; 2011). Recent applications published by Toshiba and Macronix describing emerging 3D NVMs include U.S. Pub. App. No. 20100244119 "Nonvolatile semiconductor memory device and method for manufacturing the same" (Fukuzumi et. al., filed 16 Mar. 2010) and U.S. Pub. App. No. 20100226195 "Integrated Circuit self-aligned 3D memory array and manufacturing method" (Hang-Ting Lue, filed Sep. 9, 2010). These applications generally describe approaches that involve forming layers of poly-crystalline (or amorphous) silicon and a dielectric (e.g., $SiO_2$ or $Si_3N_4$) that are then etched to define holes or trenches, and then a memory material (e.g., antifuse, ONO or SONOS memory stacks) are disposed on the exposed side edges of the poly-crystalline (or amorphous) silicon and the dielectric.

There are several problems with conventional 3D NVM approaches such as those mentioned above.

First, in each case the memory transistors' bulk, serving as channel material, is poly-crystalline or amorphous silicon. Even if this channel material is recrystallized (thermally, with the help of power lasers, etc.), the mobility of electrons is still much less in poly-crystalline or amorphous silicon than in mono-crystalline silicon. This lower electron mobility results in increased resistance of the Poly NAND string, resulting in relatively large read-access times and limitations in programming (i.e., because larger voltages are required).

Second, it is difficult to make high quality memory stack on poly-crystalline and amorphous silicon. In common SONOS and nano-dot local charge trapping devices, thermal oxide on crystalline silicon is typically used to ensure further high reliability of the memory cells (i.e., minimal threshold voltage (Vt) shifts and high retention of the stored charge). It is difficult to obtain a high quality thermal oxide on poly-crystalline silicon (i.e., when the channels of thin film transistors are formed first, as taught in U.S. Pub. App. No. 20100226195). In cases where the channels are formed last (e.g., as taught in U.S. Pub. App. No. 20100226195), the situation is even worse, because the oxide facing the transistor channel should be deposited by CVD.

Moreover, the use of poly-crystalline and amorphous silicon to form wordlines and bitlines of the memory array produces pronounced program/erase disturbs in large arrays due to high resistances and large capacitive coupling between adjacent wordline and bitline structures.

What is needed is method for generating a 3D NVM memory array that avoids the issues attributed to the conventional approaches set forth above.

SUMMARY OF THE INVENTION

The present invention is directed to a method for generating three-dimensional (3D) non-volatile memory (NVM) arrays involving forming multiple parallel horizontally-disposed mono-crystalline silicon beams that are spaced apart and arranged in a vertical stack (e.g., such that an elongated horizontal air gap is defined between each adjacent beam in the stack), forming separate charge storage layers on each of the mono-crystalline silicon beams such that each charge storage layer includes a bottom oxide layer that entirely covers (i.e., is formed on the upper, lower and opposing side surfaces of) each of the mono-crystalline silicon beams, and then forming multiple vertically-disposed conductive (e.g., poly-crystalline silicon) wordline structures (posts) next to the stack such that each wordline structure contacts each of the bitline structures in the stack by way of corresponding portions of the separate charge storage layers. By forming the bitline structures using epitaxial mono-crystalline silicon beams, the present invention provides significantly higher bitline electron mobility than prior art approaches utilizing poly-crystalline silicon bitline structures. Moreover, the mono-crystalline silicon beams facilitate the formation of thermal oxide (i.e., oxide grown by thermal oxidation) having a much higher quality than is possible when formed on the poly-crystalline silicon bitline structures used in the prior art, which enables the formation of charge trapping layers having a much higher localized charge retention reliability than those formed on low-quality oxide. Further, separating each of the mono-crystalline silicon beams (i.e., such that horizontal air gaps are defined between each adjacent beam in the stack) and maintaining this air gap separation during formation of the charge storage layers provides several advantages over the prior art approaches: first, the air gap separation between the adjacent charge storage layers reduces capacitive coupling that can lead to the program/erase disturb issues associated with conventional approaches; second, the air gap separation dramatically reduces the parasitic capacitance associated with the prior art approaches, which reduces cross-talk and read/write disturb issues, and third, the air gap also facilitates doubling the memory density.

According to a simplified exemplary embodiment of the present invention, the multiple parallel horizontally-disposed mono-crystalline silicon beams are produced by forming alternating layers of mono Si between sacrificial material layers (e.g., SiGe) over the base substrate, removing portions of the layers such that remaining portions of the layers form a stack structure including said mono-crystalline silicon beams disposed between sacrificial material structures, and removing the sacrificial material structures from between each adjacent pair of the mono-crystalline silicon beams such that each adjacent pair of beams is separated by an associated air gap. Forming the alternating layers using an easily-removable sacrificial material such as SiGe facilitates efficient exposure of the mono-crystalline silicon beams, thereby facilitating the subsequent formation of high quality charge storage layers on the beams.

According to alternative exemplary embodiments of the present invention, forming separate charge storage layers on each of the mono-crystalline silicon beams involves forming either an ONO charge trapping structure or a nano-dot-based charge trapping structure. In either case, charge storage layer formation begins by performing an optional sacrificial oxide and surface cleaning on all surfaces of each of the plurality of bitline structures, and then forming a high quality thermal oxide layer on each of the plurality of bitline structures such that the thermal oxide forms a continuous layer on the upper, lower and opposing side surfaces of each of the plurality of beams. A layer of silicon-nitride (SiN), nano-dot or other charge trapping material (e.g., high-k $Hf_xAl_yO_z$) is then formed on the bottom thermal oxide layer, and then a top oxide layer is formed over the charge trapping layer. During the formation of each layer, at least a portion of the original air gap space is maintained between adjacent beams in each stack to facilitate formation of the charge trapping layer structure as a series of concentric layers, thereby forming completed bitline structures that are separated by air gaps.

After the bitline structures are formed, wordline structures are formed by depositing a conductive material over the bitline structure stacks, and then patterning the conductive material to form separate wordline structures that contact sides of each bitline structure to form NVM cells. In a preferred embodiment the conductive material is in-situ or PoCl3 doped poly-crystalline silicon, which is relatively easy to pattern by dry etching in the manner required to form the required wordline structures. However, other conductive materials (e.g., metals or metal alloys) may also be utilized. For example, it is possible to form a conductive layer (e.g., a metal or metal alloy) having thickness of several hundreds of Angstroms (e.g., 100-300 A), and then fill the remaining space with polysilicon. According to an aspect of the present invention, the conductive material is removed from the upper surface of each stack in order to allow for separate wordline structures on each side of each bitline structure, which facilitates doubling the amount of memory storable on each bitline structure.

BRIEF DESCRIPTION OF THE DRAWINGS

These and other features, aspects and advantages of the present invention will become better understood with regard to the following description, appended claims, and accompanying drawings, where:

FIGS. 3A, 3B and 3C are simplified perspective views showing the formation of stacked mono-crystalline beams utilized in the 3D NVM memory array of FIG. 1 according to another embodiment of the present invention;

FIG. 11 is a cross-sectional side view showing the structure of FIG. 10B;

FIGS. 12A and 12B are cross-sectional end views taken along corresponding section lines shown in FIG. 11;

DETAILED DESCRIPTION OF THE DRAWINGS

The present invention relates to an improved 3D NVM array and in particular to methods for making such 3D NVM arrays. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements or structures, for example, by way of a conductive line (e.g., doped silicon or metal) formed in accordance with normal integrated circuit fabrication techniques. In contrast, the term "coupled" is used to describe either a direct connection or an indirect connection between two circuit elements that are disposed in a single path. For example, two coupled elements may be directly connected by way of a metal line, or indirectly connected by way of an intervening circuit element (e.g., a capacitor, resistor, inductor, or by way of the source/drain terminals of a transistor). Directional terms such as "upper", "upwards", "lower", "downward", "front", "rear", "side", "vertical", "horizontal", "top" and "bottom" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
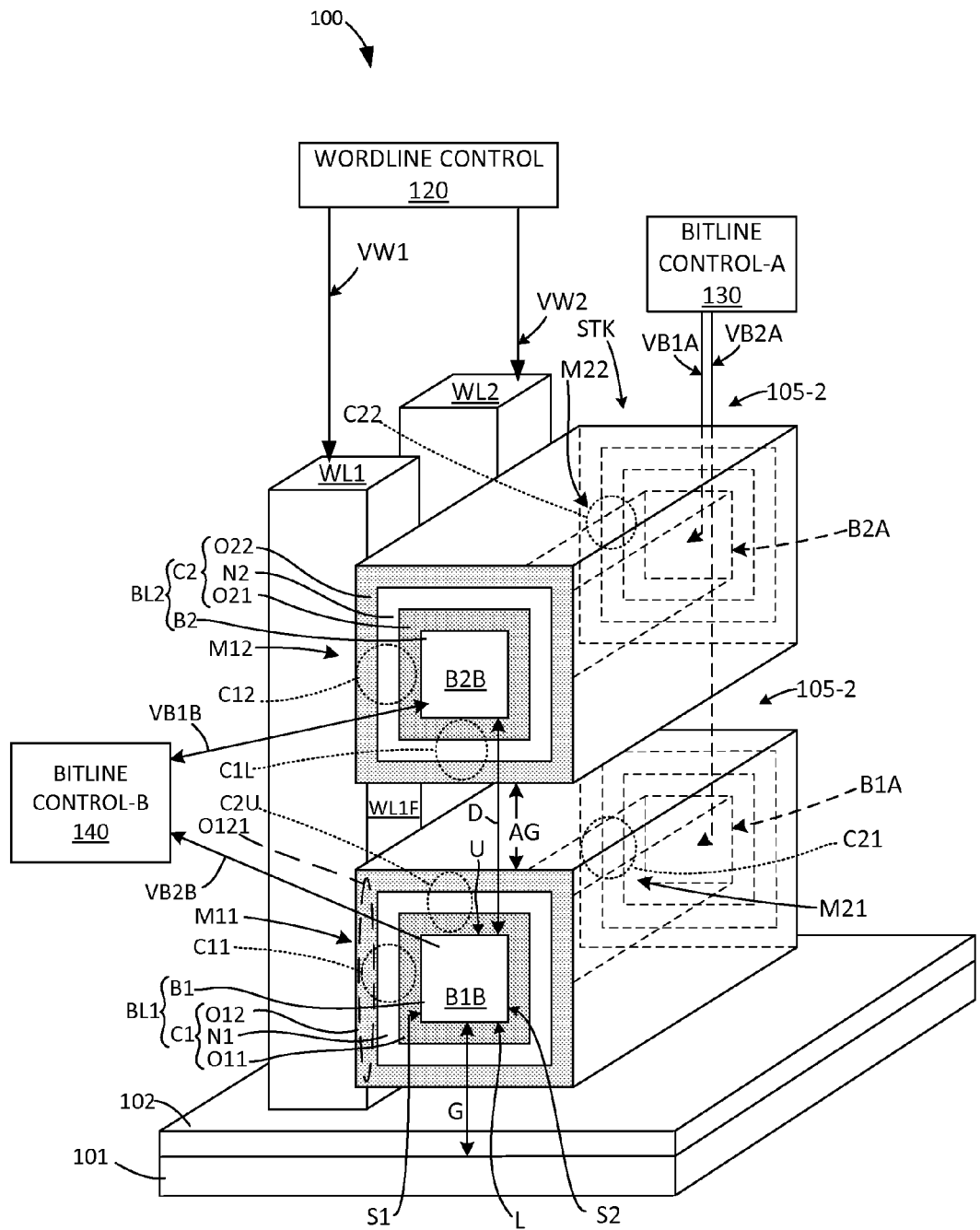
FIG. 1 is a partial perspective view and end cross-sectional views showing an exemplary portion of a 3D NVM memory array according to a simplified embodiment of the present invention.

FIG. 1 is a partial perspective view showing an exemplary portion of a three-dimensional (3D) non-volatile memory (NVM) array 100 according to a simplified embodiment of the present invention. Array 100 is formed on a semiconductor (e.g., mono-crystalline silicon) substrate 101 having a dielectric layer 102 formed thereon. The exemplary portion of array 100 shown in FIG. 1 includes two horizontally disposed bitline structures BL1 and BL2 arranged in an exemplary stack STK, and two vertically disposed wordline structures (posts) WL1 and WL2 that are positioned next to the stack. Bitline structures BL1 and BL2 respectively includes beams B1 and B2, and charge storage layers C1 and C2 respectively disposed on beams B1 and BL2.

According to a first aspect of the present invention, beams B1 and B2 comprise parallel, spaced-apart epitaxial p-type mono-crystalline silicon structures. That is, beam B1 comprises a first single elongated silicon crystal extending between ends B1A and B1B and disposed above substrate 101 (e.g., spaced from the upper surface of substrate 101 by gap distance G), and beam B2 similarly comprises a second (separate) single silicon crystal that is disposed above beam B1 and extends between ends B2A and B2B. In one embodiment, beams BL1 and BL2 are separated by a distance D that is sufficient to provide an intervening air-filled gap (described below) during the subsequent formation of charge storage layers C1 and C2. As set forth in additional detail below, NVM array 100 functions as a NAND-type memory circuit, with portions of beam B1 forming the channels of series-connected NVM cells M11 and M21, and with portions of beam B1 forming the channels of series-connected NVM cells M12 and M22. By forming beams B1 and B2 from epitaxial mono-crystalline silicon, 3D NVM array 100 provides significantly higher bitline electron mobility than prior art 3D NVM array approaches that utilizing poly-crystalline silicon ("polysilicon") bitline structures.

According to another aspect of the present invention, each charge storage layer C1 and C2 respectively include bottom (first) oxide layers O11 and O21 that entirely cover all surfaces of beams B1 and B2, respectively. Specifically, charge storage layer C1 includes an oxide layer O11 that is formed directly on beam B1 and extends in a continuous (unbroken) layer across upper surface U, lower surface L and opposing side surface S1 and S2 of beam B1. Similarly, charge storage layer C2 includes an oxide layer O21 that is disposed on all surfaces of beam B2. The efficient formation of continuous oxide layers O11 and O21 is facilitated by the exposure of all surfaces of beams B1 and B2 during the oxidation process using the techniques described below.

In accordance with a preferred specific embodiment of the present invention, bottom oxide layers O11 and O21 comprise a high quality thermal oxide, and charge trapping layers N1 and N2 comprise a high quality charge trapping material disposed on the thermal oxide. The formation of high quality thermal oxide is critical to the subsequent formation of high quality charge trapping structures. It is difficult to make high quality charge trapping structures on polysilicon (and other structures) in part because it is difficult to produce high quality thermal oxide on polysilicon structures. In particular, silicon-oxide-nitride-oxide-silicon (SONOS) and nano-dot-based local charge trapping devices require the growth of high quality thermal oxide on mono-crystalline silicon to ensure high reliability of the subsequently formed charge trapping structures (e.g., the high quality thermal oxide prevents threshold voltage shifts and serves to facilitate high retention of the stored charge). By forming beams B1 and B2 from mono-crystalline silicon and by exposing all surfaces of beams B1 and B2 during the oxidation process using the techniques described below, the present invention facilitates the formation of high quality thermal oxide layers O11 and O21. In turn, the formation of high quality thermal oxide layers O11 and O21 facilitates the formation of high quality charge trapping structures N1 and N2 using, for example, charge trapping materials such as nano-dots (silicon or metal) a nitride charge trapping layer (e.g., having a composition utilized in SONOS charge trapping stacks), or another charge trapping media such as $Hf_xAl_yO_z$.

According to an embodiment of the present invention, charge storage layers C1 and C2 respectively include top (second) oxide layers O12 and O22 that form concentric covers over the charge-trapping layers N1 and N2, respectively, and serve as a contact structures at the intersection of each post WL1 and WL2 and each bitline structure BL1 and BL2. Top oxide layers O12 and O22 may also be implemented as high-k dielectric layers. In alternative specific embodiments, top oxide layers O12 and O22 are formed by one of the following techniques: direct pyrogenic oxidation of silicon nitride, thermal oxide formed by ISSG (in-situ steam generation oxide), and oxides formed using known chemical vapor deposition (CVD) or atomic layer deposition (ALD) techniques followed by densification at high temperatures). Posts WL1 and WL2 contact corresponding vertically-oriented portions of top oxide layers O12 and O22 at each intersection with bitline structures BL1 and BL2. For example, as indicated in FIG. 1 and at the lower portion of FIG. 2, post WL1 contacts top oxide layer portion O121 of top oxide layers O12 at the intersection of post WL1 and bitline structure BL1. Similarly, post WL2 contacts a vertically-oriented portion of top oxide layer O12 at the intersection of post WL2 and bitline structure BL1, post WL1 contacts a vertically-oriented portion of top oxide layers O21 at the intersection of post WL1 and bitline structure BL2, and post WL2 contacts a vertically-oriented portion of top oxide layers O22 at the intersection of post WL2 and bitline structure BL2.

According to another embodiment of the present invention, an air-filled gap is defined between the bitline structures in each stack of 3D NVM array 100. As indicated in FIG. 1, air-filled gap AG is defined between bitline structures BL1 and BL2. In particular, charge storage layers C1 and C2 are formed using the methods described below such that a downward-facing section C1L of charge storage layer C1 is separated from an upward facing section C2U of charge storage layer C2 by air gap AG (i.e., an intervening space, occupied solely by gas or vacuum, is disposed between sections C1L and C2U). In one embodiment, portions of top oxide layers O12 and O22 may extend from and contact each other along the side edges of air gap AG, but at least a portion of downward-facing section C1L is separated from an upward facing section C2U by an air-filled region or void. Physically separating charge storage layers C1 and C2 in this way reduces capacitive coupling between bitline structures BL1 and BL2 that can lead to the program/erase disturb issues associated with conventional approaches. In addition, the air gap separation dramatically reduces the parasitic capacitance associated with the prior art 3D NVM array approaches that include dielectric or insulator structures between horizontal stacked bitlines, which reduces cross-talk and read/write disturb issues.

Referring again to FIG. 1, posts WL1 and WL2 are parallel and spaced apart (i.e., physically separated), and positioned such that NVM cells M11 to M22 are disposed on the same side of stack STK (i.e., facing side S1 of beam BL1). According to a specific embodiment of the present invention, posts WL1 and WL2 are formed from a conductive material (e.g., n- or p-doped poly-crystalline silicon that is disposed on or over dielectric layer 102, wherein each post WL1 and WL2 contacts a corresponding side portion of charge storage layers C1 and C2 at the intersection of each post WL1 and WL2 and each beam BL1 and BL2. In other embodiments posts WL1 and WL2 are generated using other conductive materials (e.g., one of metals or metal alloys such as such as Titanium Nitride (TiN) and Tantalum-Nitride (TaN) alone or in combination with polysilicon (e.g., by forming the metal/alloy as a thin film, then deposit poly, then etch the two layers together).

Referring to the upper and left side of FIG. 1, 3D NVM array 100 further includes wordline control circuit 120, a first bitline control circuit (CONTROL-A) 130 and a second bitline control circuit (CONTROL-B) 140 that apply signals (voltage) to beams BL1/BL2 and posts WL1/WL2 during program, erase and read operations in accordance with operating methods described herein. As mentioned above and described below with reference to FIG. 2, 3D NVM array 100 preferably functions as a NAND-type NVM memory array including NVM NAND string structures 105-1 and 105-2 that are respectively formed on bitline structures BL1 and BL2, and comprise NVM memory cells M11 to M22 that are formed by structural portions disposed at each bitline/wordline (beam/post) intersection. Specifically, NVM NAND string structure 105-1 is formed on beam BL1, and includes memory cells M11 and M21 that are formed at the intersections of beam BL1 and posts WL1 and WL2 as described below with reference to FIG. 2. Similarly, NVM NAND string structure 105-2 is formed on beam BL2, and includes memory cells M12 and M22 that are formed at the intersections of beam BL2 and posts WL1 and WL2. Each of NVM memory cells M11 to M22 is individually accessible as described below to store an associated data bit, and the data bits stored in memory cells in M11 to M22 are read from each NVM NAND string structure 105-1 and 150-2 using the methods described below. 3D NVM array 100 utilizes control circuitry that selectively applies suitable voltages onto beams BL1/BL2 and posts WL1/WL2 in order to produce required potentials across corresponding portions C11 to C22 of charge storage layers C1 and C2 that effect these program/erase and read operations. The control circuitry of NVM array 100 that generates the required potentials described below is depicted in a simplified form as wordline controller 120, which applies wordline signals (voltages VW1 and VW2 onto posts WL1 and WL2, respectively, first bitline control circuit 130, which applies bitline signals (voltages) VB1A and VB2A to first (rear) ends of beams BL1 and BL2, respectively, and second bitline control circuit 140, which applies bitline signals (voltages) VB1B and VB2B to second (front) ends of beams BL1 and BL2, respectively, and transmits currents from the second (front) ends of beams BL1 and BL2, respectively, to detection circuits (e.g., sense amplifiers, not shown) in accordance with the methodology described below. Those skilled in the art will recognize that the control structures shown in FIG. 1 and described below are greatly simplified for descriptive purposes, and that providing suitable control circuitry for generating the signals and performing the functions described below is within the capabilities of one skilled in the art.

Figure 2:
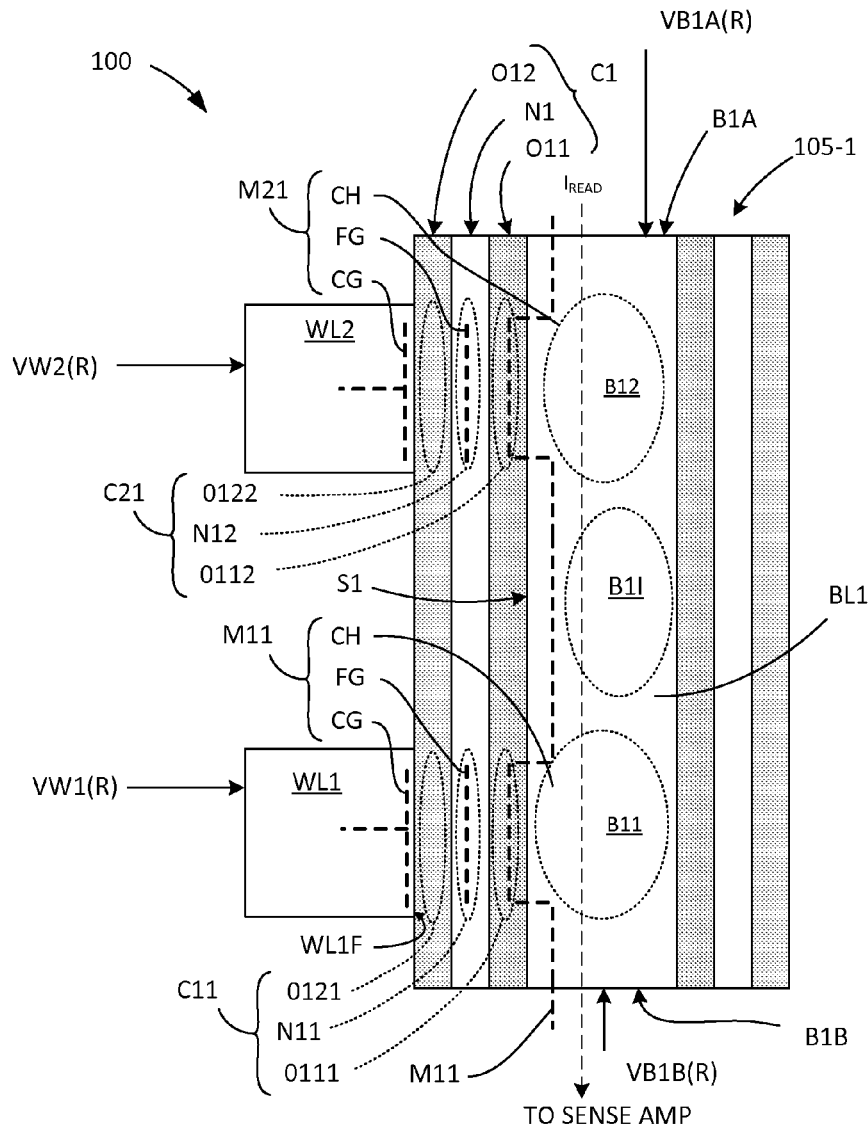
FIG. 2 is a top cross-sectional view showing a part of the 3D NVM memory array portion of FIG. 1.

FIG. 2 is a top cross-sectional view showing NVM NAND string structure 105-1 of 3D NVM array 100 in additional detail. NVM NAND string structure 105-1 includes NVM memory cells M11 and M21 that are formed by corresponding portions of beam BL1, corresponding portions of charge storage layer C1, and posts WL1 and WL2, which are described above in detail. As indicated by the dashed-line floating gate transistor diagram located in the lower portion of FIG. 2, memory cell M11 is formed at the intersection of post WL1 and beam BL1, and includes a floating gate FG formed by a charge trapping region portion N11 of nitride layer N1 that is located in portion C11 of charge storage layer C1, a control gate CG formed by the portion of post WL1 that contacts top oxide portion O121 located in charge storage layer portion C11, and a channel region CH formed by a portion BL11 of beam BL1 that contacts thermal oxide portion O111 located in charge storage layer portion C11. Similarly, memory cell M21 includes a floating gate FG formed by a charge trapping region located in portion C12, a control gate CG formed by the portion of post WL2 that contacts top oxide O12 at side portion C111, and a channel region CH formed by a second portion BL12 of beam BL1 that contacts thermal oxide O11 in charge storage portion C21.

Referring back to FIG. 1, NVM NAND string structure 105-1 is formed by memory cells M11 and M21 that are formed by charge storage layer portions C11 and C21 disposed at the intersection of bitline structure BL1 and posts WL1 and WL2. Similarly, NVM NAND string structure 105-1 includes memory cells M12 and M22 that are formed by portions of charge storage layers C1 and C2 at the intersection of bitline structure BL2 and posts WL1 and WL2. Specifically, memory cell M12 is formed by portion C12 of charge storage layer C2 that is sandwiched between post WL1 and a vertical side surface portion of beam B2 at the intersection of post WL1 and bitline structure BL2, and memory cell M22 is formed by a portion C22 of charge storage layer C2 that is sandwiched between post WL2 and beam B2 at the intersection of post WL2 and bitline structure BL2.

As indicated by the continuous dashed line passing through memory cells M11 and M21 in FIG. 2, memory cells M11 and M21 are effectively connected in series by beam B1 to form a NVM NAND string, and data values stored in memory cells M11 and M21 are read in manner similar to that used in conventional NAND-type memory circuits, where beam B1 serves both as the channels of memory cells M11 and M21 and as the series connection between memory cells M11 and M21. In particular, the control circuitry of array 100 (e.g., wordline control 120 and bitline controls 130 and 140, see FIG. 1) are operated using known techniques to generate read current along beam B1, a "read" (first) potential across the charge storage layer portion of a selected memory cell to be read, and a "bypass" (second) potential across the charge storage layer portion of the non-selected memory cell, and then detecting whether the read current is present in beam B1 (e.g., using a sense amplifier). For example, to read a "1" data value stored on the floating gate of memory cell M11 during a read operation, a read current $I_{READ}$ is generated in beam B1 (e.g., by applying different bitline voltages VB1A(R) and VB1B(R) to opposing ends B1A and B1B of beam BL1), a "bypass" voltage is generated on the control gate of memory cell M21 (e.g., by applying a wordline voltage VW2(R) on post WL2 that is high enough to open channel B12 of memory cell M21), and a "read" voltage is generated on the control gate of memory cell M11 (e.g., by applying a wordline voltage VW1(R) on post WL1 that causes channel B11 of memory cell M21 to open only if no or small charge is stored in charge trapping layer region N11). Note that memory cells M11 and M21 are spaced and operated such that inversion (current flow) in region BL1I of beam BL1 (i.e., the space between memory cells M11 and M21) is achieved by fringe fields. Note also that a "0" data value stored on the floating gate of memory cell M11 (sufficiently large trapped charge in N11) is detected by applying bitline voltages VB1A(R) and VB1B(R), applying "bypass" voltage VW2(R) on memory cell M21, and applying "read" voltage VW1(R) on memory cell M11, but in this case the current would be interrupted by the lack of flow in channel B11 due to the large charge stored in charge trapping layer region N11. A data value stored in memory cell M21 is read by reversing the order to of the wordline voltages mentioned above. The programmed or erased state of memory cells M11 and M21 are thus determined by electrons trapped in charge storage portions C11 and C21 of charge trapping layer C1. Referring briefly to FIG. 1, NVM NAND string structure 105-2, which is formed by the series connection of memory cells M12 and M22 along beam B2, operates in the manner described above.

Figure 4A:
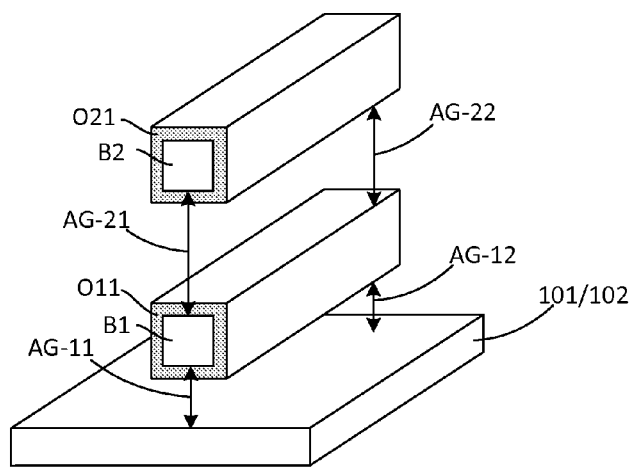
FIGS. 4A, 4B and 4C are simplified perspective views showing the formation of memory stacks on each of the mono-crystalline beams utilized in the 3D NVM memory array of FIG. 1 according to another embodiment of the present invention.
Figure 4B:
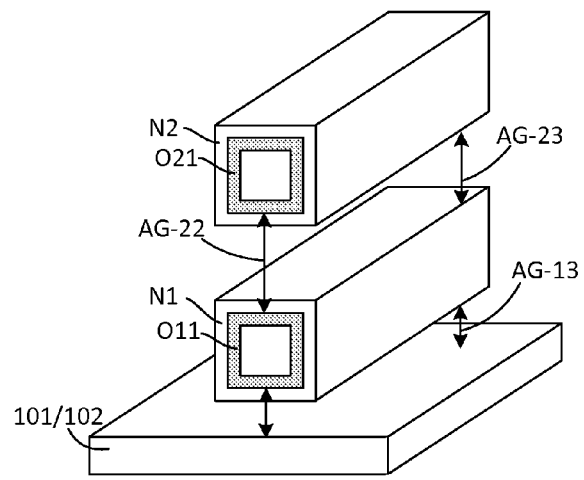
Figure 4C:
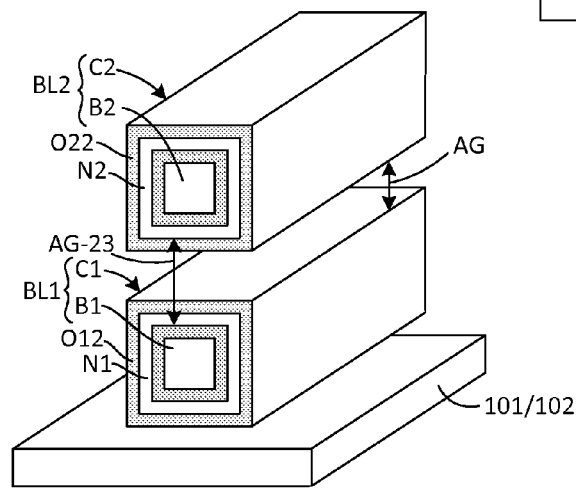
Figure 5A:
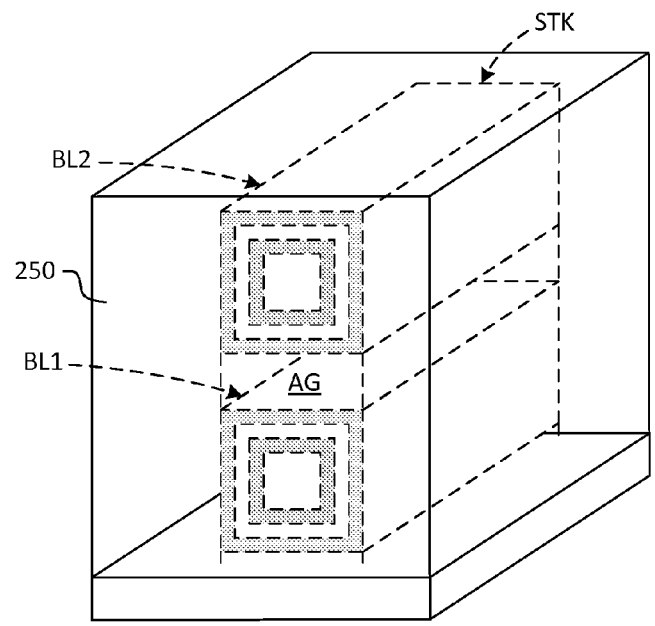
FIGS. 5A and 5B are simplified perspective views showing the formation of polycrystalline wordline structures next to each of the mono-crystalline bitline structures utilized in the 3D NVM memory array of FIG. 1 according to another embodiment of the present invention.
Figure 5B:
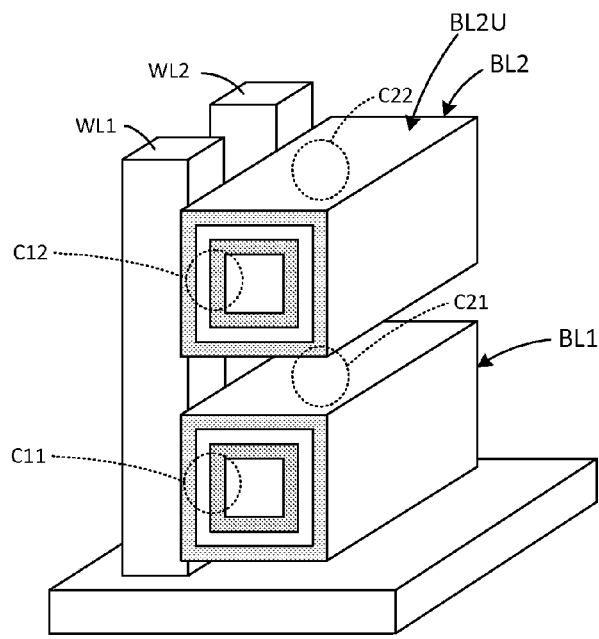

FIGS. 3A to 5B illustrate a simplified methodology utilized to generate 3D NVM array 100 according to another embodiment of the present invention. FIGS. 3A to 3C depict the formation of beams B1 and B2 such that they are arranged in a vertical stack and separated by an air gap. FIGS. 4A to 4C depict the completions of bitline structures BL1 and BL2 by forming charge storage layers C1 and C2 on beams B1 and B2, respectively. FIGS. 5A and 5B illustrate the subsequent formation of wordline structures WL1 and WL2 next to bitline structures BL1 and BL2 such that each wordline structure contacts a corresponding portion of each charge storage layer C1 and C2.

FIGS. 3A to 3C depict the formation of beams B1 and B2 according to a simplified exemplary embodiment of the present invention. First, as shown in FIG. 3A, alternating layers of mono-crystalline silicon 210 and a sacrificial material 220 are deposited or otherwise formed over silicon/dielectric base substrate 101/102. Next, as shown in FIG. 3B, the layers are etched removing portions of the mono-crystalline silicon and the sacrificial material such that remaining portions 210-11 and 210-21 of the mono-crystalline silicon layer (which form beams B1 and B2) are arranged vertically to form vertical stack STK, and are separated by a remaining portion 220-21 of the sacrificial material layer. Finally, as shown in FIG. 3C, the remaining sacrificial material is removed from between beams B1 and B2 such that each said adjacent pair of mono-crystalline silicon bitline structures is separated by said associated air gap AG.

Referring to FIG. 3A, in accordance with a specific embodiment, each mono-crystalline silicon layers 210-1 and 210-2 comprises a single p-type single silicon crystal that is formed in accordance with known techniques for forming epitaxial mono-crystalline silicon, and sacrificial material layers 220-1 and 220-1 comprise Silicon-Germanium (SiGe). The thickness of Si layers 210-1 and 210-2 is approximately 500 A, and SiGe layers 220-1 and 220-2 are approximately equals 400 A. Other sacrificial materials serving purpose of SiGe can be used, provided mono-crystalline silicon can be formed on the alternative sacrificial material.

Referring to FIG. 3B, in accordance with a specific embodiment, the removal of unused mono-crystalline silicon and sacrificial material layers (e.g., SiGe) is performed by forming a mask 230 on the alternating layers and then dry-etching the portions of the layers that are not protected by the mask (i.e., as indicated by the vertical arrows in FIG. 3B). The dry etching process is performed entirely through the alternating layers to the base substrate 101/102. Note that, at the end of the dry-etch, residual portions of mono-crystalline silicon 210-1 and 210-2 (shown in FIG. 3A) form the desired mono-crystalline silicon beams (i.e., a residual portion 210-11 of silicon layer 210-1 forms beam B1, and a residual portion 210-21 of silicon layer 210-2 forms beam B2). Note also that side etched of each beam structure (e.g., side edges S1 and S2 of beam B1) are exposed, but that residual sacrificial portions 220-11 and 220-21 contact upper/lower surfaces of each beam.

Referring to FIG. 3C, the residual sacrificial material is then removed from between beams B1 and B2, e.g., using a wet etch. In a specific embodiment in which SiGe forms the sacrificial material, wet etching is performed in $HNO_3$:$CH_3COOH$:HF at room temperature. The removal of residual sacrificial material produces an initial air gap AG-11 between beam B1 and base substrate 101/102, and an initial air gap AG-21 between beams B1 and B2. That is, removing the residual sacrificial material exposes all (i.e., upper, lower and side) surfaces of both beams B1 and B2. Note that the spacing between beams B1 and B2 during subsequent processing is maintained using the techniques described below with reference to FIGS. 8A-8C.

Referring to FIG. 4A, formation of the charge storage layers on exposed beams B1 and B2 begins with an optional sacrificial oxide and surface clean of beams B1 and B2, and then bottom oxide layers O11 and O12 are respectively formed using thermal oxide techniques on beams B1 and B2 such that each thermal oxide layer entirely covers its associated beam. That is, as described above with reference to FIG. 1, bottom oxide layer O11 comprises a (e.g., 50 A thick) layer of thermal oxide that entirely covers upper surface U, lower surface L and opposing side surfaces S1 and S2 of each beam B1 and B2. In an exemplary embodiment, standard oxidation is performed in a temperature range of 800 to 850° C. in an $O_2/N_2$ mixture. As set forth above, by exposing all surfaces of mono-crystalline silicon beams B1 and B2 (e.g., by providing initial air gaps AG-21 and AG-11 between beams B1 and B2 and prior to this step, the present invention facilitates the formation of high quality thermal oxide that facilitates the subsequent formation of highly reliable local charge trapping structures. Note that bottom oxide layers O11 and O21 are formed such that their entire peripheral surface is exposed (e.g., a residual air gap AG-12 is located between base structure 101/102 and bottom oxide layer O11, and bottom oxide layers O11 and O21 are separated by an air gap AG-22).

Referring to FIG. 4B, the next step of forming the charge storage layers involves depositing or otherwise forming charge trapping material layers N1 and N2 on bottom (e.g., thermal) oxide layers O11 and O21. According to a specific embodiments of the present invention, because bottom oxide layers O11 and O21 are entirely exposed (e.g., separated by initial air gaps AG-22), charge trapping material layers N1 and N2 are formed on all surfaces of bottom oxide layers O11 and O21. In addition, the formation of charge trapping material layers N1 and N2 includes forming silicon nitride SiN (e.g., diclorsilane/ammonia CVD Silicon nitride formed in a temperature range of 680 to 750° C.) on bottom oxide layers O11 and O21. In an alternative specific embodiment, charge trapping material layers N1 and N2 are formed by depositing nano-dots on bottom oxide layers O11 and O21. Note that charge trapping material layers N1 and N2 are formed such that their entire peripheral surface is exposed (e.g., a residual air gap AG-13 is located between base structure 101/102 and nitride layer N1, and nitride layers N1 and N2 are separated by an air gap AG-23). In an alternative embodiment the charge trapping material comprises a high-k material such as $Hf_xAl_yO_x$.

Referring to FIG. 4C, the final step of forming the charge storage layers C1 and C2 involves forming top oxide layers O12 and O22 on charge trapping material layers N1 and N2, respectively. As with the formation of charge trapping material layers N1 and N2, because bottom oxide layers O11 and O21 are entirely exposed (e.g., separated by initial air gaps AG-23), top oxide layers O12 and O22 are formed on all surfaces of charge trapping material layers N1 and N2, respectively. In one embodiment, the formation of top oxide layers O12 and O22 includes one of: (i) performing direct high temperature (above 1000° C., e.g., 1050° C.) pyrogenic oxidation of the nitride charge trapping material (when used), (ii) depositing at least one of a high temperature oxide (HTO) or other chemical vapor deposition (CVD) dielectric with subsequent densification and/or oxidation in oxygen, (iii) forming the top oxide by nitride oxidation in ISSG (in-situ steam generation) system at 900-950° C., or (iv) performing an atomic layer deposition (ALD) process to generate a desirable high-k thick top oxide layer structure comprising a $SiO_2$ layer and a high-k dielectric (e.g., alumina) layer. Alternatively, when charge trapping material layers N1 and N2 comprise materials consistent with ONO-type NVM structures, any top oxide formation process utilized for the associated ONO-type NVM structure may be utilized. Note that the formation of top oxide layers O12 and O22 completes the formation of bitline structures BL1 and BL2 (i.e., made up of beams B1 and B2 and charge storage layers C1 and C2, respectively), and that top oxide layers O12 and O22 are formed such that air gap AG is provided between adjacent bitline structures BL1 and BL2.

FIGS. 5A and 5B depict the subsequent formation of wordline structures according to an embodiment of the present invention. Referring to FIG. 5A, a conductive material layer 250 is conformally deposited over stack STK (i.e., such that material 250 does not enter air gap AG between bitline structures BL1 and BL2), and then conductive material layer 250 is patterned using known techniques to form wordline structure WL1 and WL2 that contact charge trapping layer regions C11, C12, C21 and C22, as shown in FIG. 5B. In a preferred embodiment, conductive material layer 250 comprises a thick (e.g., 2500 angstrom (A)) layer of doped poly-crystalline silicon because poly-crystalline silicon is relatively easy to pattern in the manner required to form wordline structures WL1 and WL2. In other embodiments, conductive materials such as metal or metal alloys (e.g., TiN or TaN) may also be utilized as a thin (e.g., 100-300 A) sub-layer under polysilicon. As indicated in FIG. 5B, according to an aspect of the present invention, the conductive material is removed from the top of stack STK (e.g., from upper surface BL2U of uppermost bitline BL2) in order to allow for separate wordline structures on each side of each bitline structure (as described below with reference to FIG. 6), which facilitates doubling the amount of memory storable on each bitline structure BL1 and BL2.

Figure 6:
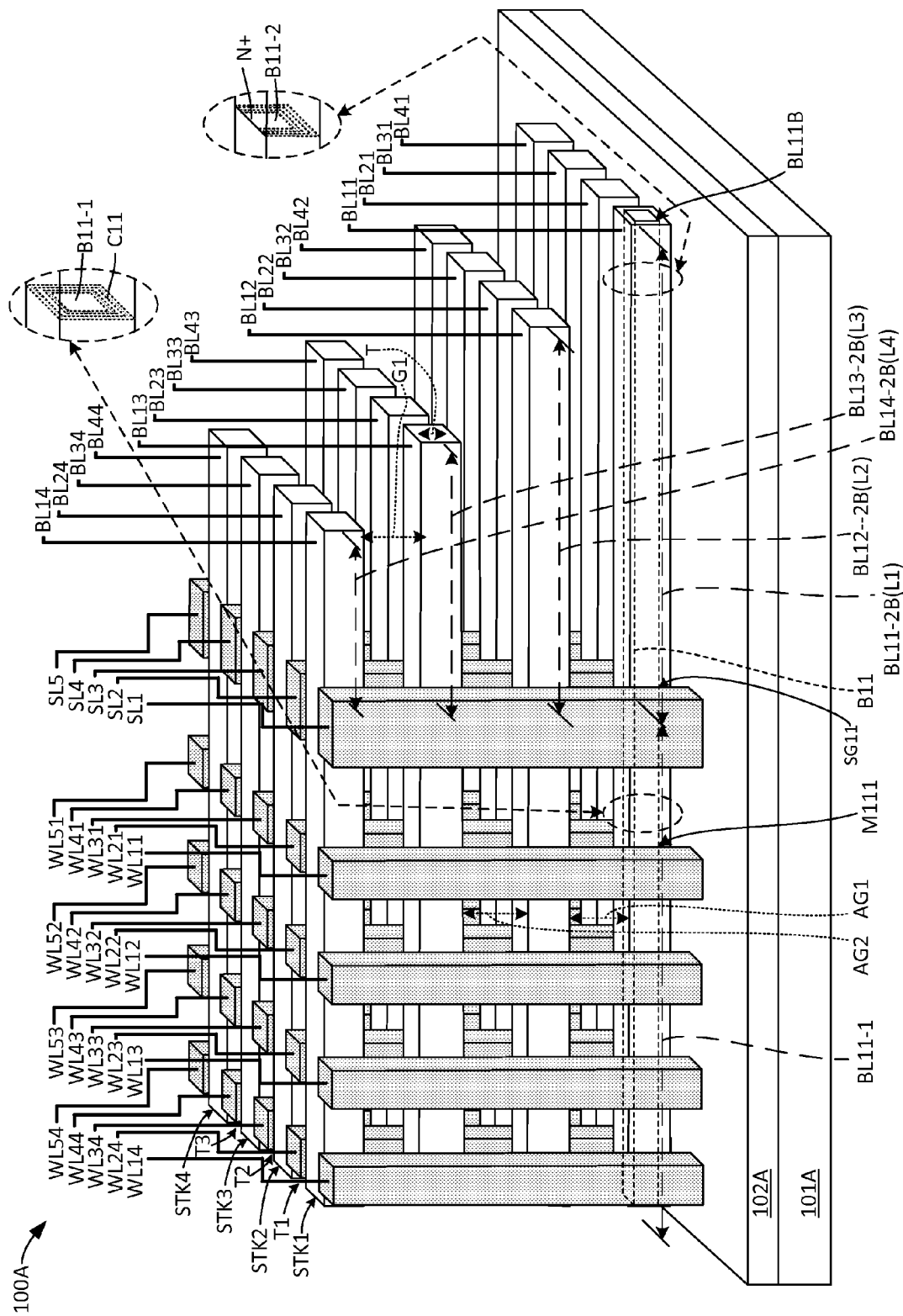
FIG. 6 is a perspective view showing an exemplary portion of a simplified 3D NVM memory array according to another embodiment of the present invention.

FIG. 6 is a perspective view showing an exemplary portion of a simplified 3D NVM memory array 100A according to another embodiment of the present invention. 3D NVM memory array 100A is similar to 3D NVM memory array 100 (see FIG. 1) in that it includes multiple parallel horizontally-disposed bitline structures BL11 to BL44 and multiple vertically-disposed conductive wordline structures (posts) WL11 to WL54. Further, each bitline structure BL11 to BL44 includes a mono-crystalline silicon beam (e.g., as indicated in the dashed-line ovals, bitline structure BL11 includes a beam B11 comprising a single silicon crystal that extend along NAND string section BL11-1 and to a second end BL11B of bitline structure BL11), and a first portion of each bitline structure BL11 to BL44 is entirely covered by a charge storage layer (e.g., as indicated in the uppermost dashed-line oval, portion BL11-1 of bitline structure BL11 is entirely covered by a charge storage layer C11 in the manner and composition described above with reference to FIG. 1). Further, posts WL11 to WL54 are disposed next to bitline structures BL11 to BL44 such that each post contacts the charge storage layer formed on each bitline structure in at least one stack to form NVM cells in the manner described above. For example, post WL11 contacts charge storage layer C11 to form an NVM cell M111 at the intersection of post WL11 and bitline structure BL11, and similarly contacts the charge storage layers to form NVM cells at the intersections of post WL11 and each of bitlines BL12, BL13 and BL14.

A first distinction between 3D NVM memory array 100A and 3D NVM memory array 100 (see FIG. 1) is that bitline structure BL11 to BL44 are arranged in multiple vertical stacks STK1 to STK4. In the exemplary embodiment shown in FIG. 6, each stack STK1 to STK4 includes four bitline structures that are arranged in a vertical series. For example, stack STK1 includes bitline structures BL11, BL12, BL13 and BL14, where bitline structure BL12 is positioned above bitline structure BL11, bitline structure BL13 is positioned above bitline structure BL12, and bitline structure BL14 is positioned above bitline structure BL13. Similarly, stack STK2 includes bitline structures BL21, BL22, BL23 and BL24, stack STK3 includes bitline structures BL31, BL32, BL33 and BL34, and stack STK4 includes bitline structures BL41, BL42, BL43 and BL44. An air gap (similar to that described above with reference to FIG. 1) is present between each adjacent pair of bitline structures in each stack (e.g., air gap AG1 is provided between bitline structures BL11 and BL12, and air gap AG2 between bitline structures BL12 and BL13). Note that each adjacent pair of stacks is separated by an elongated trench (e.g., stack STK1 is separated from stack STK2 by trench T1, stack STK2 is separated from stack STK3 by trench T2, and stack STK3 is separated from stack STK4 by trench T3).

A second distinction between 3D NVM memory array 100A and 3D NVM memory array 100 (see FIG. 1) is that bitline structure BL11 to BL44 are contacted on two sides by wordline structures (posts) WL11 to WL54, whereby each bitline structure BL11 to BL44 provides a NVM NAND string structure including NVM cells formed along both of its sides. For example, referring to the left side of FIG. 7, (first group) posts WL11 to WL14 contact bitline structure BL11 along side S1 to form NVM cells M111, M121, M131 and M141, respectively, to form a NVM NAND string structure 105-11 similar to NVM NAND string structure 105-1, which is described above with reference to FIG. 2. However, NVM NAND string structure 105-11 differs from NVM NAND string structure 105-1 in that (second group) posts WL21 to WL24, which are disposed in trench T1, contact bitline structure BL11 along side S2 to form NVM cells M211, M221, M231 and M241, respectively. That is, NVM NAND string structure 105-11 includes two four-cell NAND strings instead of one (i.e., where memory cells M111, M121, M131 and M141 form the first NAND string, and memory cells M211, M221, M231 and M241 form the second NAND string), thereby allowing each bitline structure (NVM NAND string structure) to store twice the amount of data. Note that posts WL21 to WL24 also contact a first side of bitline structure BL21 to form NVM cells M212, M222, M232 and M242, respectively, and posts WL31 to WL34, which are disposed in trench T2, contact a second side of bitline structure BL21 to form NVM cells M312, M322, M332 and M342, respectively, thereby forming a second double-density NVM NAND string structure 105-21 on bitline structure BL21 while only adding one additional row of wordlines. Similarly, posts WL31 to WL34 also contact a first side of bitline structure BL31 to form NVM cells M313, M323, M333 and M343, respectively, and posts WL41 to WL44, which are disposed in trench T3, contact a second side of bitline structure BL31 to form NVM cells M413, M423, M433 and M443, respectively, to form a third double-density NVM NAND string structure 105-31 on bitline structure BL31. Finally, posts WL41 to WL44 also contact a first side of bitline structure BL41 to form NVM cells M414, M424, M434 and M444, respectively, and posts WL51 to WL54 contact a second side of bitline structure BL41 to form NVM cells M514, M524, M534 and M544, respectively, to form a fourth double-density NVM NAND string structure 105-41 on bitline structure BL41. Referring briefly to FIG. 6, similar double density NAND strings are provided on each bitline structure in each of the layers located above bitline structures BL11, BL21, BL31 and BL41 in array 100-1. By forming each bitline structure of array 100-1 with high quality thermal oxide and charge trapping layers separated by air gaps in the manner described above, and by providing independently accessible wordline structures that contact both sides of each bitline structure, 3D NVM array 100-1 provides a data storage density that is twice that of conventional 3D NVM arrays.

A third distinction between 3D NVM memory array 100A and 3D NVM memory array 100 (see FIG. 1) is that each bitline structure includes a conductive service section that is used to pass signals between the NAND string and the array's control circuitry (not shown) by way of select transistors. For example, as shown in FIG. 6, bitline BL11 includes a NAND string (first) section BL11-1 that includes a semiconductive (first) portion B11-1 of beam B11 entirely covered by charge storage layer C11 (see uppermost dashed-line oval), and a service (second) section BL11-2 including a conductive (second) portion B11-2 of beam B11 having an exposed upper surface and a diffused N+ dopant that renders portion B11-2 electrically conductive. 3D NVM array 100-1 also includes vertically-disposed select-line structures SL1 to SL5 that are disposed between the NAND string and service sections of each bitline structure. For example, NAND string section BL11-1 is contacted by wordline structures WL11-WL14 and WL21-WL-24 in the manner described above, and a vertically-disposed select-line structure SL1 contacts charge storage layer C11 to form a select gate SG11 at a junction between NAND string (first) section BL11-1 and service section BL11-2, which is formed at the junction of select-line structure SL1 and bitline structure BL11.

In accordance with an embodiment of the present invention, the NAND string section of each bitline structure is disposed between two conductive service sections. Referring to the left side of FIG. 7, which is a top view showing the lowermost layer of array 100-1, NAND string section BL11-1 is disposed between service section BL11-2A and service section BL11-2B. Service section BL11-2A extends between wordline structure WL-14 (i.e., the wordline structure located closest to end BL11A of bitline structure BL11) and either end BL11A or a contact T11A that serves to transmit signals between the array's control circuitry and bitline BL11. In contrast, service section BL11-2B extends between select line structure SL1 and either end BL11B or a contact T11B that serves to transmit signals between the array's control circuitry and bitline BL11. Service sections BL11-2A and BL-2B are formed in the manner set forth below with reference to FIG. 16.

Figure 7:
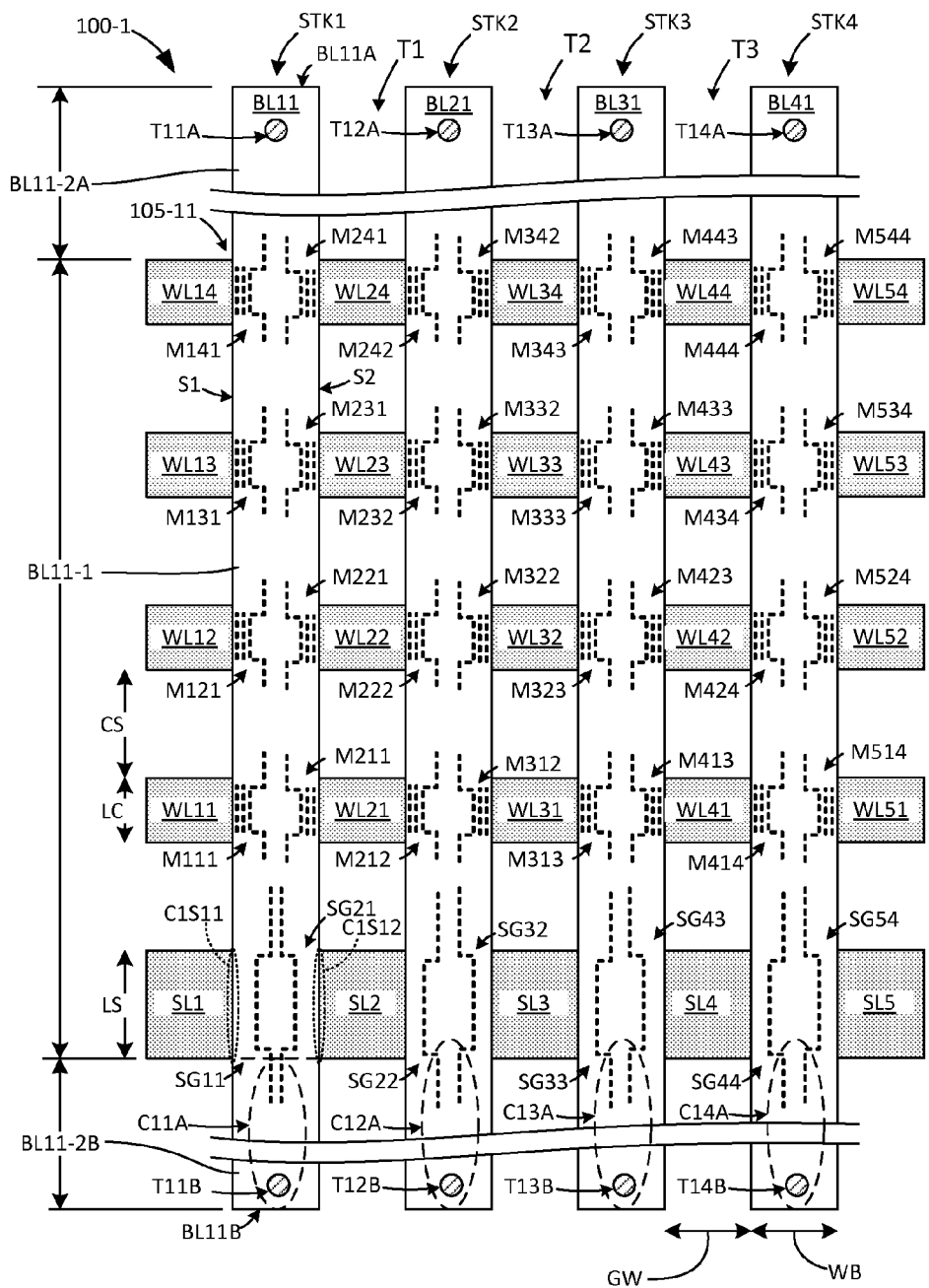
FIG. 7 is a partial top view of the 3D NVM memory array portion of FIG. 6.

As indicated in FIG. 7, select-line structures SL1-SL5 contact corresponding bitline structures in each stack STK1 to STK4 in a manner similar to that described above with reference to wordline structures BL11 to BL54 to form select gates SG11 to SG54. For example, as shown in FIG. 7, select-line structure SL1 contacts a corresponding portion C1S11 of charge storage layer C11 to form select gate SG11, and select-line structure SL2 contacts a corresponding portion C1S12 of charge storage layer C11 to form select gate SG21. Similarly, select lines SL2 and SL3 form select gates SG22 and SG32 on bitline structure BL-21, select lines SL3 and SL4 form select gates SG33 and SG43 on bitline structure BL-31, and select lines SL4 and SL5 form select gates SG44 and SG54 on bitline structure BL-41, each select gate being disposed between a NAND string section and a service section of the respective bitline structure. Each select gate controls one side of the bit line structure. From the service section side the two select gates have the same N+ diffusion (connected source or drain). In read and write, two neighboring posts (e.g. posts WL14 and WL24) never control the same bit line simultaneously. Select-line structures SL1-SL5 are formed simultaneously with wordline structures BL11-BL54, and thus have the same composition (e.g., polysilicon). However, select-line structures SL1-SL5 have a length LS that is larger than the length LC of each wordline structure for reasons set forth below (i.e., the channel length of the select transistors is greater than the channel length of each NVM cell).

Referring to FIG. 6, in accordance with an embodiment of the present invention, the service sections of each bitline structure in each stack has a different length that forms a staircase arrangement, and contacts are made to the exposed ends of each service section. For example, each service (second) section BL11-2, BL12-2, BL13-2 and BL14-2 of bitline structures BL11, BL12, BL13 and BL14 in stack ST1 has a respective different length L1, L2, L3 and L4 (i.e., measured from select-line structure SL1 to the respective end of each bitline structure), where the lengths are arranged to form a staircase pattern that exposes the upper surface at the end of each service section. That is, length L1 of service section BL11-2 is longer than length L2 of service section BL12-2 to form an exposed upper surface portion of service section BL11-2 located adjacent to end BL11B. Similarly, length L2 of service section BL12-2 is longer than length L3 of service section BL13-2 to form an exposed upper surface portion of service section BL12-2, and length L3 of service section BL13-2 is longer than length L4 of service section BL14-2 to form an exposed upper surface portion of service section BL13-2. As described below in additional detail with reference to FIG. 17, a similar staircase is formed at the opposite end of each stack STK1-STK5, and vertical metal contacts are formed at each exposed end portion indicated by the vertical lead lines in FIG. 6.

Exemplary operating conditions of 3D NVM array 100-1 will now be described. Referring to FIG. 6, in the exemplary embodiment mono-crystalline silicon beams B11 to B44 have a thickness T of 500 A (angstroms), and are separated by a gap distance of 400 A. The charge trapping layer formed on each bitline structure BL comprises ONO including a thermal $SiO_2$ bottom oxide layer having a thickness of 30 A, an SiN charge trapping material layer having a thickness of 60 A, and a top oxide made up of combined thermal and CVD oxide having a thickness of 110 A. Referring to FIG. 7, each beam has a width WB in the range of 0.2 to 0.3 microns (um), and are separated by a gap width GW of approximately 0.18 um. Each NVM cell has a channel length LC in the range of 0.14 to 0.18 um, while each select transistor has a channel length LS in the range of 0.35 to 0.5 microns (this length difference automatically excludes leakages due to short channel effects, similar to standard demands in NAND NVM devices). A cell spacing CS between each adjacent pair of NVM cells is in the range of 0.14 to 0.18 microns.

With an array fabricated to include the dimensions set forth in the previous paragraph, in read-out, a pass voltage of approximately 8 to 10 V is applied to the wordline structures of non-selected cells (which is above the threshold voltage (Vt) of programmed cells). The system voltage (i.e., Vdd, e.g., 1.8 V when the array is produced using a 0.18 um fabrication process) is applied to one end of the associated bitline structure, and the other end of the associated bitline structure is connected to ground (0 V). The associated select gate is opened using a voltage in the range of 3.3 to 8 V, which ensures no trapping (programming) of the charge trapping layer of each select gate by F-N injection. The select gates in unselected blocks are cutoff during read (and program) operations like in standard NAND memories, with the opposite sides of each bitline structure belonging to different blocks. For example, during a first read phase, data is read from the block including memory cells M111-M141 and M313-M343 by generating a read current in beams BL11 and BL31 and applying the select voltage to select-line structures SL1 and SL3, thereby opening select gates SG11 and SG33, and applying the wordline voltages mentioned above to posts WL11-WL-14 and WL31-WL34. During a second phase, data is read from the block including memory cells M211-M241 and M413-M443 by generating a read current in beams BL11 and BL31 and applying the select voltage to select-line structures SL2 and SL4, thereby opening select gates SG21 and SG43, and applying wordline voltages to posts WL31-WL-34 and WL41-WL44. Next, data is read from the block including memory cells M212-M242 and M414-M444 by generating a read current in beams BL21 and BL41 and applying the select voltage to select-line structures SL2 and SL4, thereby opening select gates SG22 and SG44, and applying wordline voltages to posts WL21-WL-24 and WL41-WL44. Finally, data is read from the block including memory cells M312-M342 and M514-M544 by generating a read current in beams BL21 and BL41 and applying the select voltage to select-line structures SL3 and SL5, thereby opening select gates SG32 and SG54, and applying wordline voltages to posts WL31-WL-34 and WL51-WL54.

During program operations, both sides of the string are grounded, bypass voltages are applied to the wordlines of non-selected (non-programmed) cells (i.e., 8 to 10V, as during read operations), and the program voltage applied to the wordline structure of the programmed cell is in the range of 14 to 20 V. Non-selected strings (along the wordline post) are disconnected (i.e., floating) for self-boosting to avoid program disturb.

During erase operations voltages from −14 to −20V are applied to the selected wordline structure while approximately +5V is applied to the selected beam (bitline) and −5V is applied to the associated select gate from both sides of the string. The selects are closed but there is a BBT (band-to-band) generation of holes (supply of holes to the p-body of the string). This is because it is not possible to use standard NAND erase scheme (i.e., a positive voltage applied to the P-body and wordline structures grounded) because the body of crystalline channels is floating (not connected).

Figure 8A:
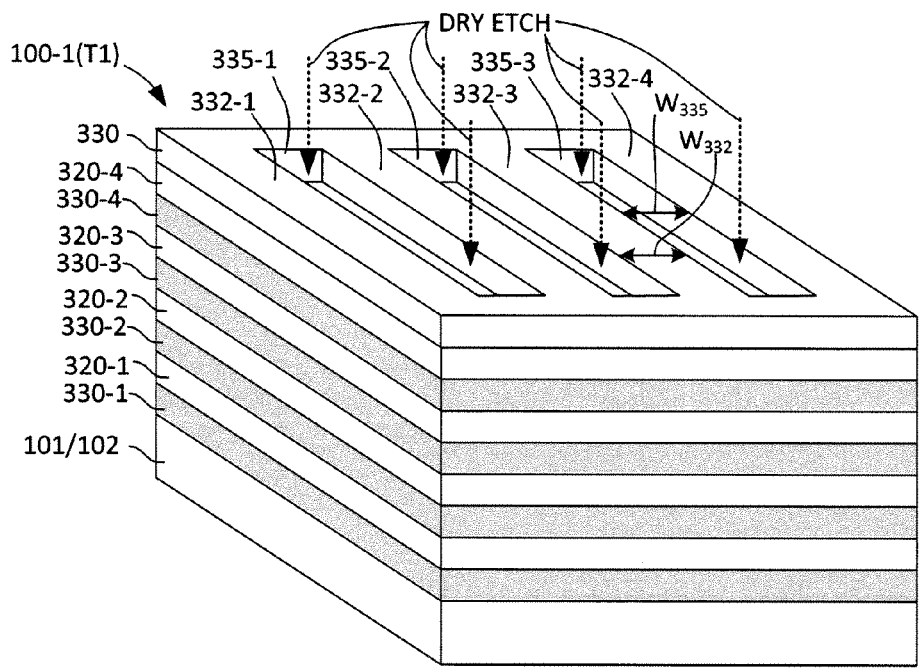
FIGS. 8A and 8B are simplified perspective views showing the formation of multiple stacks of mono-crystalline beams utilized in the 3D NVM memory array of FIG. 6 according to another embodiment of the present invention.
Figure 8B:
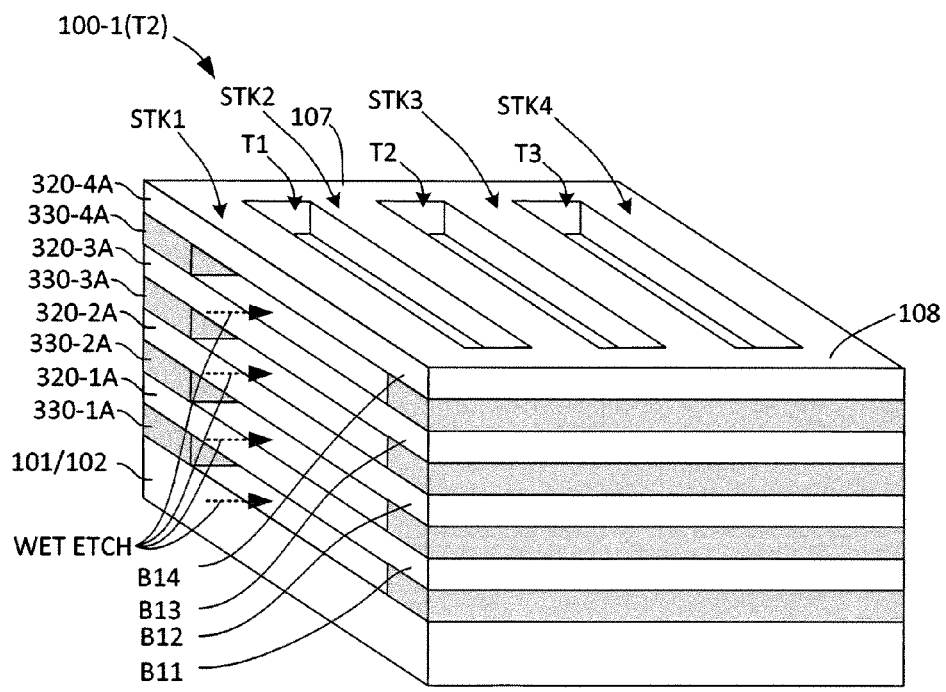
Figure 9:
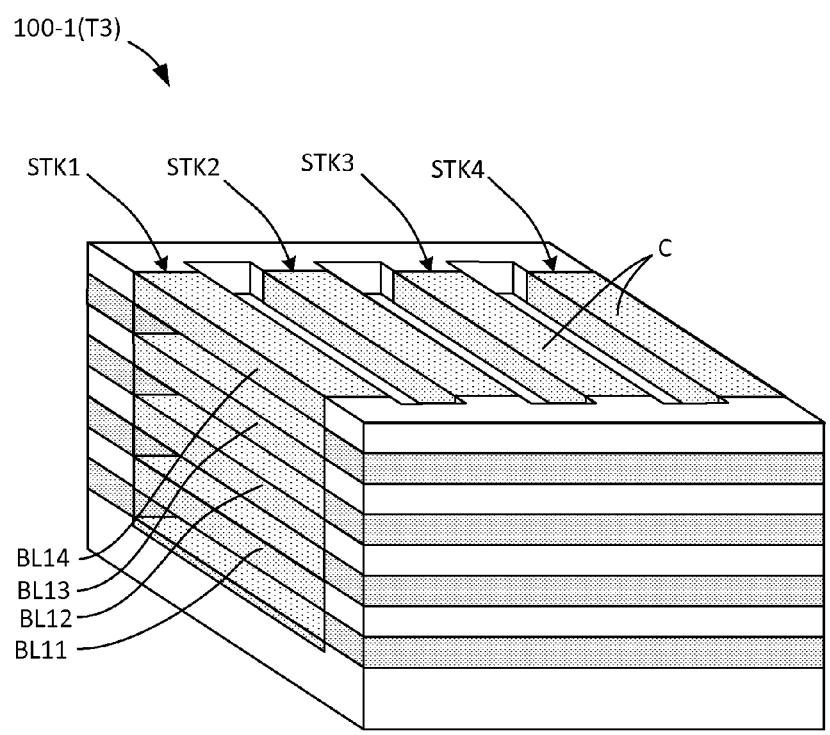
FIG. 9 is a perspective view showing the formation of charge storage layers on each of the mono-crystalline beams utilized in the 3D NVM memory array of FIG. 6 according to another specific embodiment of the present invention.

FIGS. 8A to 17 illustrate a method for generating 3D NVM array 100-1 (see FIGS. 6 and 7) in accordance with another embodiment of the present invention. FIGS. 8A and 8B are simplified perspective views showing the formation of multiple stacks of mono-crystalline beams utilizing methods similar those described above with reference to FIGS. 3A-3C such that an elongated trench is defined between each adjacent stack of said bitline structures that are separated by trenches. FIG. 9 depicts the formation of charge storage layers on each mono-crystalline beam that each said charge storage layer includes a bottom oxide layer that entirely covers (i.e., forms a continuous layer on the upper, lower and opposing side surfaces of) each of the mono-crystalline silicon beams utilizing methods similar to those described above with reference to FIGS. 4A-4C. FIGS. 10A and 10B depict the subsequent formation of vertically-disposed wordline structures next to each stack such that each said wordline structure contacts a corresponding portion of the charge storage layers formed on each beam in at least one of the stacks. FIGS. 11-17 show additional processing steps utilized to protect the NVM cells and to produce the service areas disposed at the end of each bitline of 3D NVM array 100-1 (see FIG. 6).

Referring to FIG. 8A, similar to the method described above with reference to FIGS. 3A-3C, the production method begins by forming single-crystal Si layers 310-1 to 310-4 and SiGe layers 320-1 to 320-4 in an alternating pattern over base substrate 101/102. In a specific embodiment, Si layers 310-1 to 310-4 have a thickness in the range of 200 to 1000 A, and SiGe layers 320-1 to 320-4 have a thickness in the range of 300 to 800 A. A typical content of the SiGe layers 320-1 to 320-4 is $Si_{0.8}Ge_{0.2}$. A mask 330 is then formed over the Si and SiGe layers that is patterned to include elongated strips 332-1 to 332-4 having a nominal width $W_{332}$ in the range of 0.2 to 0.3 um, and elongated openings 335-1 to 335-3 defined between each adjacent pair of strips having a nominal width of approximately 0.18 um. Note that elongated parallel openings 335-1 to 335-3 to not extend to the end of the Si/SiGe layers for reasons that will become clear below. Dry etching of exposed Si and SiGe material is then performed through openings 335-1 to 335-3 (indicated by the vertical arrows in FIG. 8A), and then mask 330 is removed. The resulting structure (e.g., as indicated in FIG. 8B) includes mono-crystalline silicon beams arranged in four stacks STK1 to STK4 (e.g., stack STK1 is formed by beams B11 to B14), where adjacent pair of stacks is separated by an associated trench T1-T3 (i.e., stacks STK1 and STK2 are separated by trench T1, stacks STK2 and STK3 are separated by trench T2, and stacks STK3 and STK4 are separated by trench T3). In addition each beam of each stack is connected to opposing end sections 107 and 108, which are respectively made up of residual SiGe portions 330-1A to 330-3A and mono-Si portions of 320-1A to 320-3A, such that each beam extends between end sections 107 and 108 (e.g., beams B11 to B14 are integrally connected at opposing ends to end sections 107 and 108).

FIG. 8B shows structure 100-1(T2) during a wet etch that is performed to remove the SiGe material from between the mono-crystalline silicon disposed in each stack STK1 to STK4 (e.g., from between beams BL11 to BL14 of stack STK1, as indicated by the horizontal arrows). In one embodiment, the wet etching is performed using HNO3:CH3COOH:HF at room temperature. Note that SiGe is retained in end sections 107 and 108 to support the mono-Si beams at each end.

FIG. 9 is a perspective view showing array structure 100-1(T3) after the formation of charge storage layers C on each of the exposed mono-crystalline beams using the processes described above with reference to FIGS. 4A-4C, thereby completing the basic bitline structures in each stack STK1 to STK4 (e.g., bitline structures BL11 to BL14 in stack STK1). In one embodiment, charge trapping layers C comprise ONO including a thermal $SiO_2$ bottom oxide layer having a thickness in the range of 20 to 70 A, an SiN charge trapping material layer having a thickness in the range of 40 to 80 A, and a top oxide made up of combined thermal and CVD oxide having a thickness in the range of 60 to 120 A. Deposition starts from sacrificial oxide and surface clean, then thermal oxide (typically 50 A) is grown, followed by diclorsilane/ammonia CVD Silicon nitride and combined: 20 A thermal oxide/100 A HTO or 20 A thermal oxide/150 A ALD Alumina. The result is a high quality ONA memory stack similar to those used in TaN—AlO—SiN-oxide-Si (TANOS) standard two-dimensional nitride memories. When depositing the top CVD dielectric (HTO or ALD Alumina), the narrow vertical gaps between the beams are practically closed, leaving air gaps. At the memory stack formation step, the substrate 101/102, except the areas under the service sections, is covered by a dielectric (the same as covers the monocrystalline beams).

Figure 10A:
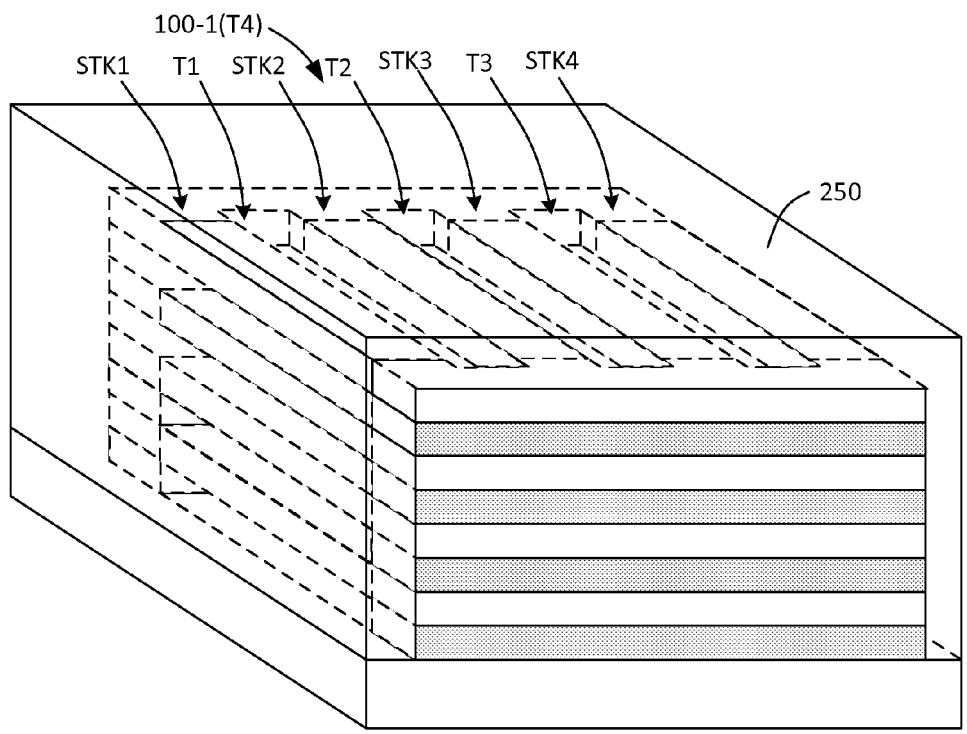
FIGS. 10A and 10B are perspective views showing the formation of bitline and select line structures according to another specific embodiment of the present invention.
Figure 10B:
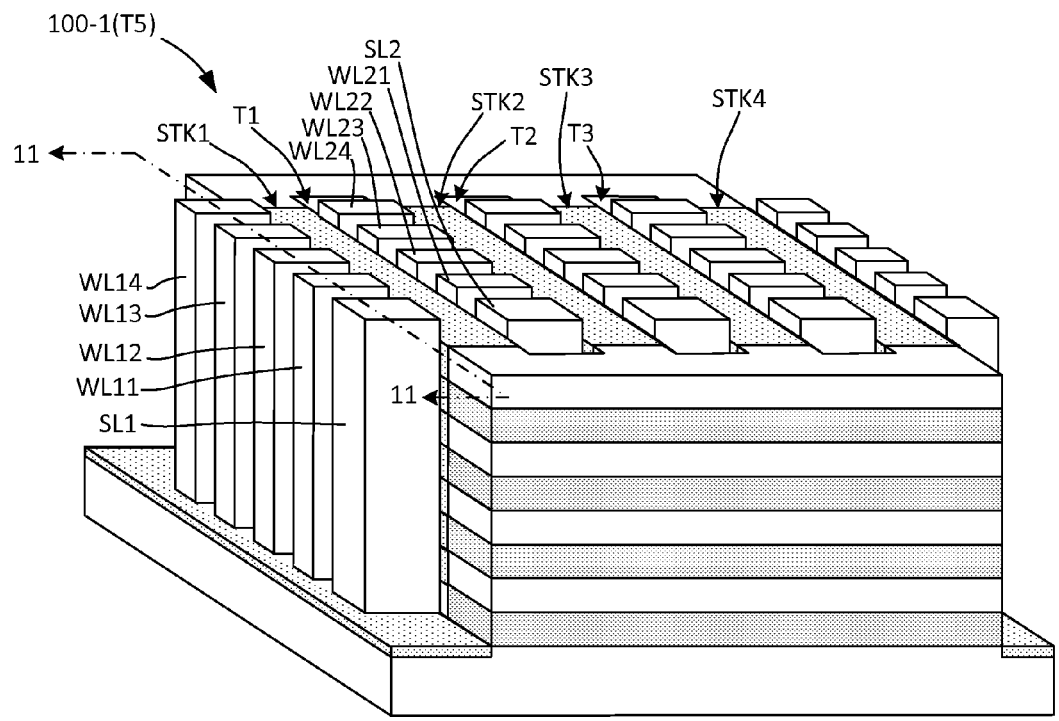

FIGS. 10A and 10B are perspective views showing the formation of bitline and select line structures such that groups of wordline structures are formed in each trench, with each such wordline structure contacting bitline structures in both stacks that are separated by the trench. FIG. 10A shows structure 100-1(T4) after the formation of a poly-crystalline silicon layer 250 (e.g., having a thickness of approximately 2500 A) such that the polysilicon conformally fill trenches T1, T2 and T3 (i.e., the vertical gaps between stacks STK1, STK2, STK3 and STK4) but does not penetrate into the closed air gaps between the mono-Si beams. Poly-lithography is then performed according to known techniques to form the wordline structures and select-line structures, which are shown in FIG. 10B, such that each stack STK-1 to STK-4 is disposed between two sets of wordlines/select-lines (e.g., the bitline structures of stack STK1 is contacted on one side by posts WL11-WL14 and select-line structure SL1, and on the other side by posts WL21-WL24 and select-line structure SL2). Similarly, each wordlines/select-line group disposed in one of trenches T1 to T3 contacts bitline structures of both stacks separated by the associated trench (e.g., posts WL21-WL24 and select-line structure SL2 contact the bitline structures of stack STK1 on one side of trench T1, and the bitline structures of stack STK2 on the other side of trench T1).

FIG. 11 is a cross-sectional side view showing structure 100-1(T5) of FIG. 10 taken along section line 11-11 of FIG. 10. The cross-section shows bitline structures BL11 to BL14, each including a mono-SI beam covered by an ONO stack, and posts WL11 to WL14 and select-line structure SL1 that contact the side edges of bitline structures BL11 to BL14.

FIGS. 12A and 12B are cross-sectional end views taken along corresponding section lines shown in FIG. 11. FIG. 12A shows that the polysilicon forming posts WL13 to WL53 conformally fills in the spaces between stacks STK1 to STK4 such that the air gaps separating the bitline structures in each stack remain intact (e.g., as indicated in the left portion of FIG. 12A, air gaps AG are disposed between each adjacent pair of bitline structures BL11 to BL14. In one embodiment, the side openings of air gaps AG are closed first by the top CVD layer of the ONO stacks, and then by the polysilicon used to form the wordline/select-line structures. FIG. 12B, which is taken along section line 12B-12B in FIG. 11, shows air gap spaces AG remaining between the bitline structures in each stack STK1 to STK4 (e.g., between each adjacent pair of bitline structures BL11 to BL14). In one embodiment, the side openings of air gaps AG are closed by the top CVD layer of the ONO stacks, and in addition by polysilicon used to form the wordline/select-line structures. The air gap spaces remaining between each adjacent bitline structure have a height on the order of 400 A (i.e., approximately twice the ONO thickness), and have a width on the order of 0.14 um when array 100-1 is formed using 0.18 um technology).

Figure 13:
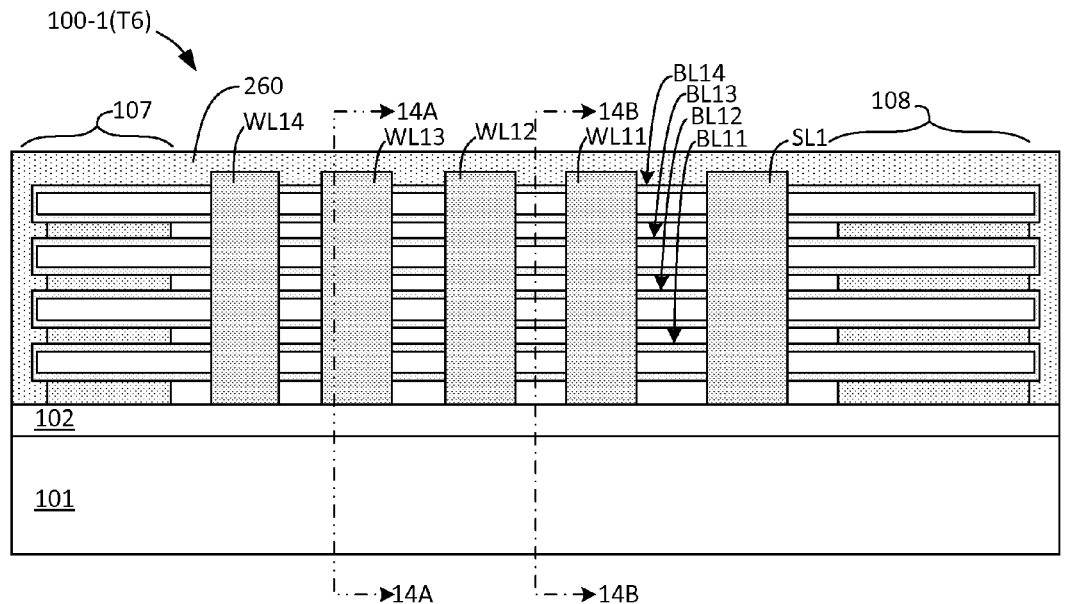
FIG. 13 is a cross-sectional side view showing the structure of FIG. 11 after the formation of a protective layer according to another specific embodiment of the present invention.
Figures 14A, 14B:
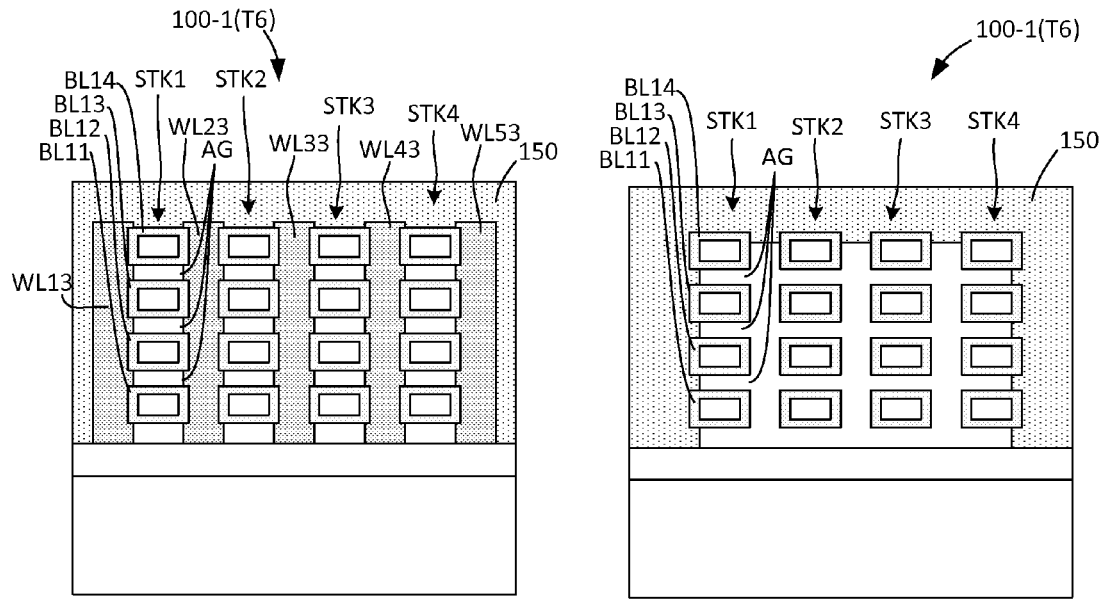
FIGS. 14A and 14B are cross-sectional end views taken along corresponding section lines shown in FIG. 13.

FIG. 13 is a cross-sectional side view (section line 11-11 of FIG. 10) showing structure 100-1(T6), and FIGS. 14A and 14B are cross-sectional side views taken along section lines 14A-14A and 14B-14B of FIG. 13. These figures show the structure of FIG. 11 after the subsequent formation of a protective layer 260 that covers all of the wordline structures (e.g. posts WL13 to WL53, shown in FIG. 14A) and all of the stacks STK1 to STK4 (e.g., as shown in FIG. 14B) without entering any of the air gaps (e.g., air gaps AG between bitline structures BL11 to BL14, as shown in FIGS. 14A and 14B). As indicated on the outside edges of FIG. 13, protective layer 260 is also formed over end portions 107 and 108, but as described below this portion is subsequently removed. In one specific embodiment comprises undoped silicate glass (USG) deposited by plasma enhanced CVD, serves as a protecting layer during resist removal at the third masking step (described below with reference to FIG. 15). That is, without protective layer 260, the edges of the memory cells can be damaged during mask removal.

Figure 15:
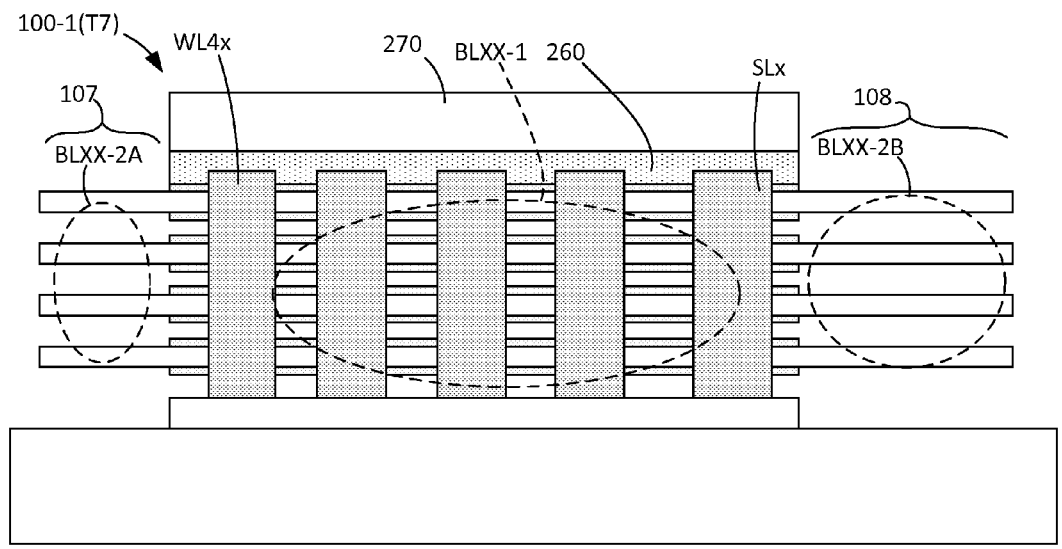
FIG. 15 is a cross-sectional side view showing the structure of FIG. 13 after end sections of the bitline structures are exposed for further processing.

FIG. 15 is a cross-sectional side view showing the structure 100-1(T7) in which a mask 270 is formed over NAND string sections BLXX-1 of the array (but not over end sections 107 and 108), then protective material (USG) is removed from service sections BLXX-2A and BLXX-2B located at opposite ends of NAND string sections BLXX-1, and then the SiGe material is removed from between the bitline structure portions located in service sections BLXX-2A and BLXX-2B. The SiGe etch is performed using the wet etch used to expose the mono-Si beams. Mask 270 is then removed, with USG layer 260 serving as a protective layer during the resist removal.

Figure 16:
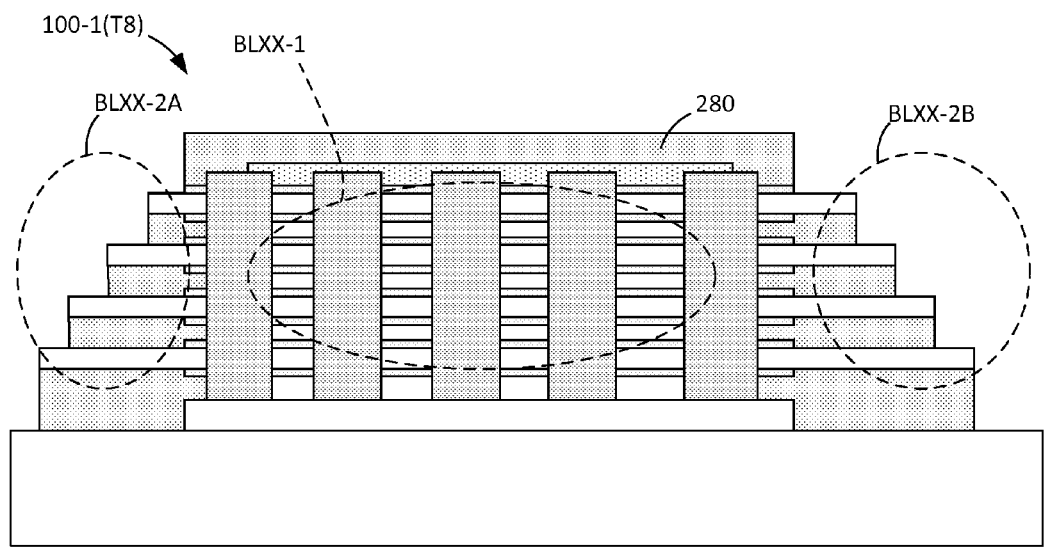
FIG. 16 is a cross-sectional side view showing the structure of FIG. 15 after ends of the bitline structures are separated and formed in a staircase arrangement.

FIG. 16 is a cross-sectional side view showing the structure 100-1(T8) during which the spaces between the bitline structures in service sections BLXX-2A and BLXX-2B are again closed by depositing a second USG layer 280, which serves to make service sections BLXX-2A and BLXX-2B mechanically stronger and to allow selective silicon/oxide etch during contact staircase formation. The staircase arrangement is then formed using masks and dry etch selective to Si and SiO$_2$. Separation of the mono-Si into individual beam structures in the service sections occurs at this point. The surfaces of each exposed end section are processed to provide an upper N+ region that serves as a conductor between the associated NAND string and metal contacts (described below). The N+ regions are formed by PoCl$_3$ doping (800-900° C., 10-20 min) at the stage when service sections BLXX-2A and BLXX-2B are patterned and "bare" mono-Si beam sidewall surfaces are exposed. NAND string sections BLXX-1 are masked by ONO at this stage. Additional bake (same temperature range) is performed to shift the N+ edge under the gates of the select transistors. The other side of select gates and the spaces between the memory cells (WLs) are not doped.

Figure 17:
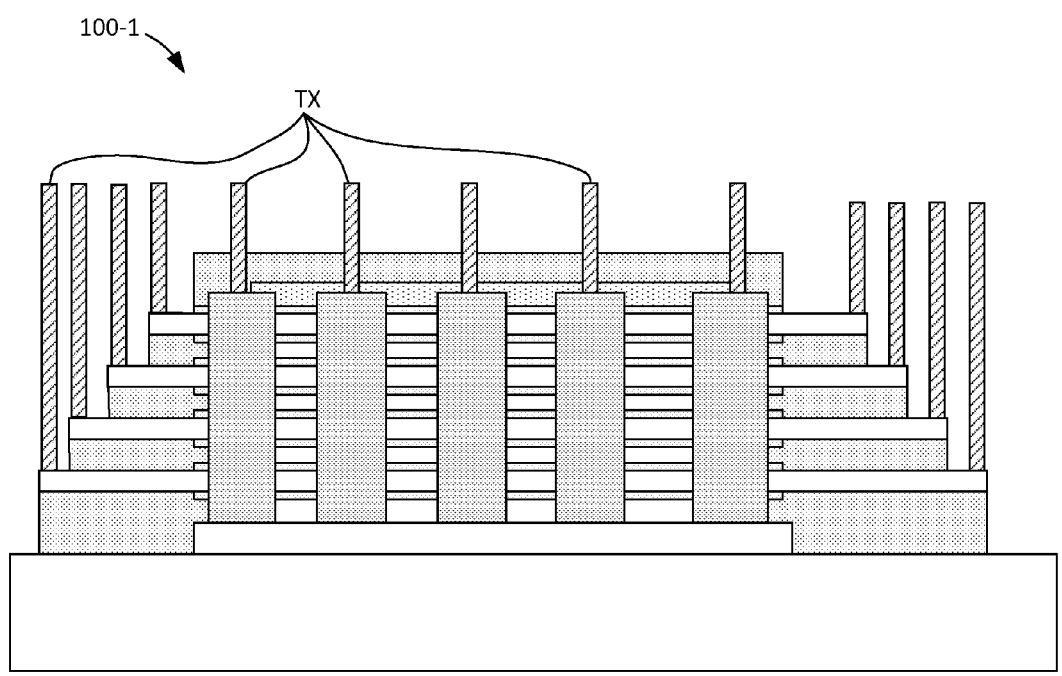
FIG. 17 is a cross-sectional side view showing the structure of FIG. 16 after formation of metal contacts to the various wordline, select-line and bitline structures.

FIG. 17 is a cross-sectional side view showing completed 3D NVM array 100-1 after metal contacts TX to the various wordline, select-line and bitline structures are formed using known techniques. Note that the contact connections to each bitline structure is made by way of the N+ doped region disposed at each end of the bitline structures.

As set forth above, 3D NVM array 100-1 is generated in a manner that facilitates the formation of back-end (i.e., formed over i.e., formed over Active in semiconductor structures on insulator) memory devices having extremely high storage potentials. Thus, the present invention solves two main limitations of existing 3D NVM solutions having local charge storage memory transistors in the Back-End. In particular, the present invention addresses the problem of low electron mobility (high resistance) of polysilicon channels by providing mono-crystalline silicon-based bitline (channel) structures that exhibit much faster read access times. In addition, the present invention addresses the problem of low quality ONO charge trapping media by forming high quality thermal "bottom" oxide layers and top oxide layers on all surfaces of mono-crystalline silicon bitline beams, thereby facilitating ONO (and other) charge trapping media having the high quality retention necessary for multi-level cell (MLC) operations.

Although the present invention has been described with respect to certain specific embodiments, it will be clear to those skilled in the art that the inventive features of the present invention are applicable to other embodiments as well, all of which are intended to fall within the scope of the present invention. For example, bitline structures made of n-type material and contact connections doped with boron (P+), and word lines doped N+ and P– bitline structures made of SiGe (silicon selectively etched off) may also be used.

The invention claimed is:

1. A method for generating a three-dimensional (3D) non-volatile memory (NVM) array comprising:
    forming a plurality of parallel horizontally-disposed mono-crystalline silicon beams that are arranged in a vertical stack such that an associated air gap is defined between each adjacent pair of beams in the stack;
    forming a charge storage layer on each of the mono-crystalline silicon beams such that each said charge storage layer includes a oxide layer that entirely covers an associated said beam, and forming a plurality of parallel, spaced-apart vertically-disposed wordline structures next to the stack such that each said wordline structure contacts substantially only a vertical side portion of each of said charge storage layers disposed on said plurality of beams in the stack.

2. The method according to claim 1, wherein forming the plurality of parallel horizontally-disposed mono-crystalline silicon beams comprises:
    forming alternating layers of mono-crystalline silicon and a sacrificial material over a substrate;
    removing portions of the mono-crystalline silicon and sacrificial material layers such that remaining portions of the layers form the stack including said mono-crystalline silicon beams disposed between sacrificial material structures; and
    removing the sacrificial material structures from between each adjacent pair of the mono-crystalline silicon beams such that each said adjacent pair of mono-crystalline silicon beams is separated by said associated air gap.

3. The method according to claim 2, wherein forming alternating layers of mono-crystalline silicon and a sacrificial material over a substrate comprises forming a layer of Silicon-Germanium (SiGe) between each adjacent layer of mono-crystalline silicon.

4. The method according to claim 3, wherein removing portions of the mono-crystalline silicon and sacrificial material layers comprises dry-etching the mono-crystalline silicon and SiGe.

5. The method according to claim 4, wherein removing the sacrificial material structures comprises removing the SiGe from between each adjacent layer of mono-crystalline silicon using a wet etch.

6. The method according to claim 1, wherein forming the charge storage layers on each of the mono-crystalline silicon beams comprises:
    performing a sacrificial oxide and surface clean on upper, lower and opposing side surfaces of each of the plurality of beams; and
    forming a thermal oxide layer on each of the plurality of beams such that the thermal oxide forms a continuous layer on the upper, lower and opposing side surfaces of each of the plurality of beams.

7. The method according to claim 6, wherein forming the charge storage layers on each of the mono-crystalline silicon beams further comprises forming a charge trapping material layer on said thermal oxide layer.

8. The method according to claim 6,
    wherein forming said charge trapping material layer comprises one of depositing nano-dots on said thermal oxide layer, forming a silicon-nitride (SiN) layer on said thermal oxide layer, and forming a layer of high-k based Hf$_x$Al$_y$O$_z$ on said thermal oxide layer, and
    wherein forming the charge storage layers further comprises forming a second oxide layer on the nitrogen layer.

9. The method according to claim 8, wherein forming the second oxide layer on the charge trapping material layer comprises one of performing direct high temperature pyrogenic oxidation of the charge trapping material layer, depositing at least one of a high temperature oxide or other chemical vapor deposition dielectric, performing a nitride oxidation in an in-situ steam generation (ISSG) system, and (iv) performing an atomic layer deposition (ALD) process.

10. A method for generating a three-dimensional (3D) non-volatile memory (NVM) array comprising:
    forming a plurality of spaced-apart, parallel, horizontally-disposed mono-crystalline silicon beams that are arranged in a plurality of vertical stacks such that a trench is defined between each adjacent pair of stacks of said mono-crystalline silicon beams;
    forming a plurality of charge storage layers, each said charge storage layer being disposed on an associated said mono-crystalline silicon beams such that each said charge storage layer includes a first oxide layer that entirely covers an associated one of the mono-crystalline silicon beams, and forming a plurality of parallel, spaced-apart vertically-disposed wordline structures next to each stack such that each said wordline structure contacts a corresponding portion of said charge storage layers formed on each of the plurality of beams in at least one associated stack of said plurality of stacks, wherein the corresponding portions are disposed on a vertical side edge of each beam in the at least one associated stack.

11. The method according to claim 1,
wherein forming said plurality of vertically-disposed wordline structures comprises:
  depositing a conductive material layer over the stack, and
  patterning the conductive material layer to form said plurality of wordline structures,
wherein depositing said conductive material layer comprises depositing one of poly-crystalline silicon, a metal, and a metal alloy, and
wherein patterning the conductive material layer comprises removing portions of said conductive material layer disposed over the stack such that adjacent pairs of said wordline structures disposed on opposite sides of said stack are electrically isolated from each other.

12. The method according to claim 1, wherein forming said plurality of vertically-disposed wordline structures further comprises simultaneously forming a select-line structure next to the stack such that said select-line structure contacts a side portion of each of said charge storage layers disposed on said plurality of beams in the stack.

13. The method according to claim 1, wherein forming the plurality of parallel horizontally-disposed mono-crystalline silicon beams comprises forming a plurality of stacks extending between opposing end structures, each stack including a group of said beams, and each adjacent pair of stacks being separated by an intervening trench.

14. The method according to claim 13, wherein forming said plurality of vertically-disposed wordline structures comprises forming a group of said wordline structures in each said intervening trench such that each wordline structure of said group contacts each bitline structure in said adjacent pair of stacks separated by said intervening trench.

15. The method according to claim 13, further comprising forming a protective layer covering the plurality of posts and the plurality of bitline structures.

16. The method according to claim 15, wherein forming said protective layer comprises forming undoped silicate glass (USG) over the plurality of posts and the plurality of bitline structures.

17. The method according to claim 13, further comprising:
  patterning service portions of said bitline structures extending into said opposing end structures such that said end structures in each said stack define a staircase arrangement, and
  applying an N+ dopant to said service portions of said bitline structures.

18. The method according to claim 17, further comprising forming a plurality of metal contacts, each said metal contact being disposed on an associated service portion of said plurality of bitline structures.

19. A method for generating a three-dimensional (3D) non-volatile memory (NVM) array comprising:
  forming a plurality of parallel horizontally-disposed mono-crystalline silicon beams that are spaced apart and arranged in a vertical stack;
  forming a charge storage layer on each of the mono-crystalline silicon beams such that horizontal portions of the charge storage layers disposed on opposing surfaces of each adjacent pair of mono-crystalline silicon beams are separated by an air gap; and
  forming a plurality of parallel, spaced-apart vertically-disposed wordline structures next to the stack such that each said wordline structure is connected to each of the plurality of mono-crystalline silicon beams in the stack by way of corresponding vertical portions of each said charge storage layer, wherein the corresponding vertical portions are disposed on side edges of the bitline structures and form memory devices.

20. The method according to claim 10, wherein forming said plurality of vertically-disposed wordline structures comprises:
  depositing a single conductive material layer over the plurality of vertical stacks such that the single conductive material layer fills each said trench, and
  patterning the conductive material layer to form said plurality of wordline structures such that at least one said wordline structure disposed in a first trench contacts a side portion of each of said charge storage layers disposed on said plurality of beams in both first and second stacks separated by said first trench.

* * * * *